(12) United States Patent
Kutsukake et al.

(10) Patent No.: US 8,399,953 B2
(45) Date of Patent: Mar. 19, 2013

(54) SEMICONDUCTOR DEVICE AND METHOD FOR MANUFACTURING THE SAME

(75) Inventors: Hiroyuki Kutsukake, Kanagawa-ken (JP); Kenji Gomikawa, Kanagawa-ken (JP); Yoshiko Kato, Kanagawa-ken (JP); Norihisa Arai, Saitama-ken (JP); Tomoaki Hatano, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 12/885,031

(22) Filed: Sep. 17, 2010

(65) Prior Publication Data

US 2011/0220996 A1 Sep. 15, 2011

(30) Foreign Application Priority Data

Mar. 15, 2010 (JP) ................................. 2010-058411

(51) Int. Cl.
*H01L 29/00* (2006.01)
*H01L 29/167* (2006.01)
*H01L 21/336* (2006.01)

(52) U.S. Cl. . 257/497; 257/610; 257/611; 257/E21.443; 257/E29.063; 438/305; 438/306

(58) Field of Classification Search .................. 257/315, 257/320, 322, 497, 500, 504, 610, 611, E29.063, 257/E21.443; 438/257, 258, 302, 305–307
See application file for complete search history.

(56) References Cited

U.S. PATENT DOCUMENTS

| 6,518,625 | B1 | 2/2003 | Nishida et al. | |
|---|---|---|---|---|
| 6,969,663 | B2 * | 11/2005 | Takahashi | 438/400 |
| 7,119,413 | B2 | 10/2006 | Kutsukake et al. | |
| 2005/0035382 | A1 * | 2/2005 | Shinohara et al. | 257/290 |
| 2008/0230812 | A1 * | 9/2008 | Disney et al. | 257/272 |
| 2010/0009529 | A1 * | 1/2010 | Taniguchi et al. | 438/591 |

FOREIGN PATENT DOCUMENTS

| JP | 60-250645 | 12/1985 |
|---|---|---|
| JP | 2001-203275 | 7/2001 |
| JP | 2006-59978 | 3/2006 |
| JP | 2007-234878 | 9/2007 |
| JP | 2008-234820 | 10/2008 |
| JP | 2010-157720 | 7/2010 |

OTHER PUBLICATIONS

Office Action issued Jul. 26, 2012 in Japanese Application No. 2010-058411 (With English Translation).

* cited by examiner

*Primary Examiner* — Hsien Ming Lee
(74) *Attorney, Agent, or Firm* — Oblon, Spivak, McClelland, Maier & Neustadt, L.L.P.

(57) ABSTRACT

A semiconductor device includes a semiconductor substrate, an element isolation insulating film dividing an upper portion of the substrate into a plurality of first active regions, a source layer and a drain layer, a gate electrode, a gate insulating film, a first punch-through stopper layer, and a second punch-through stopper layer. The source layer and the drain layer are formed in spaced to each other in an upper portion of each of the first active regions. The first punch-through stopper layer is formed in a region of the first active region directly below the source layer and the second punch-through stopper layer is formed in a region of the first active region directly below the drain layer. The first punch-through stopper layer and the second punch-through stopper layer each has an effective impurity concentration higher than the semiconductor substrate. The first punch-through stopper layer and the source layer are separated in the channel region. The second punch-through stopper layer and the drain layer are separated in the channel region.

14 Claims, 23 Drawing Sheets

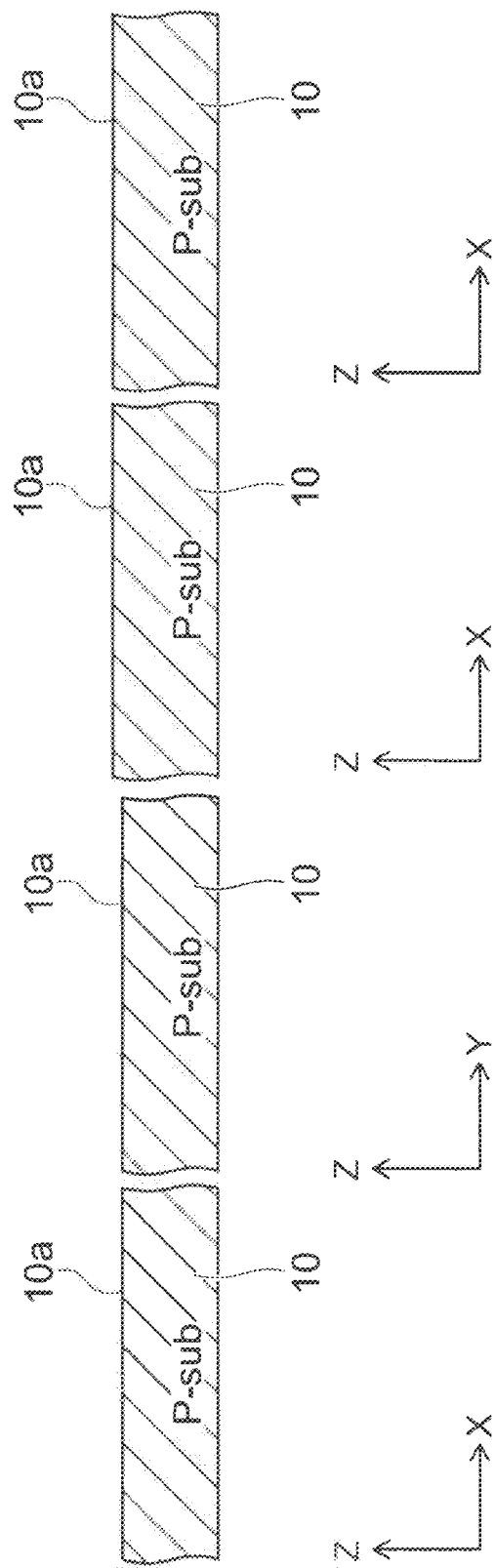

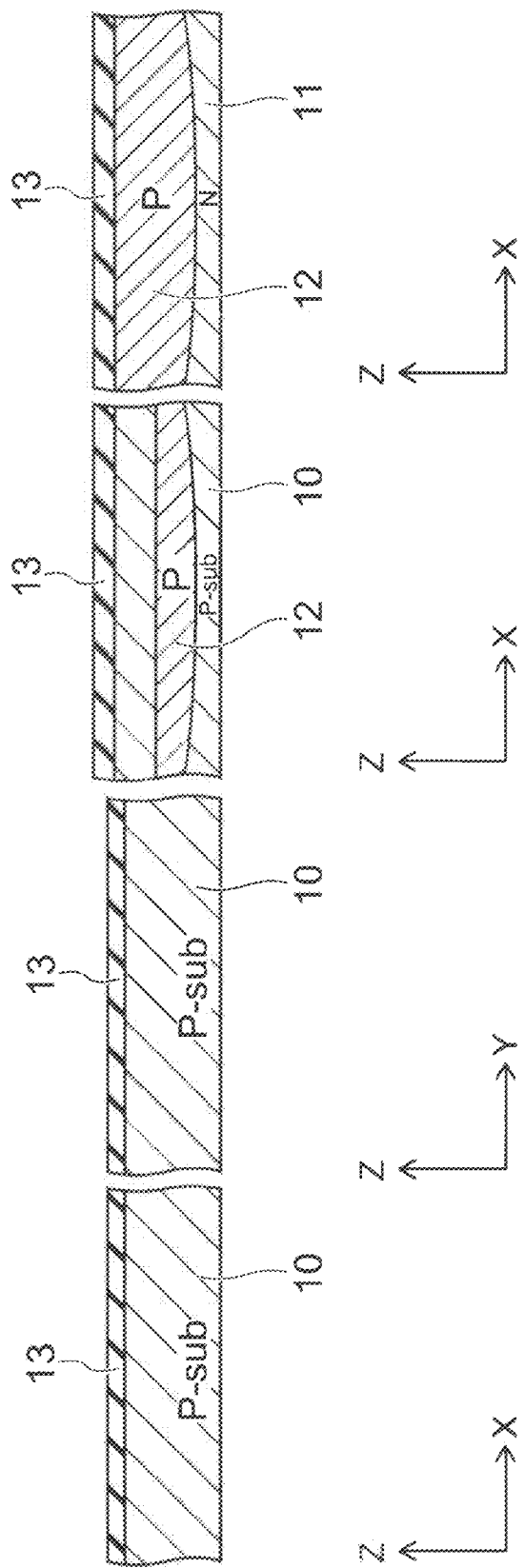

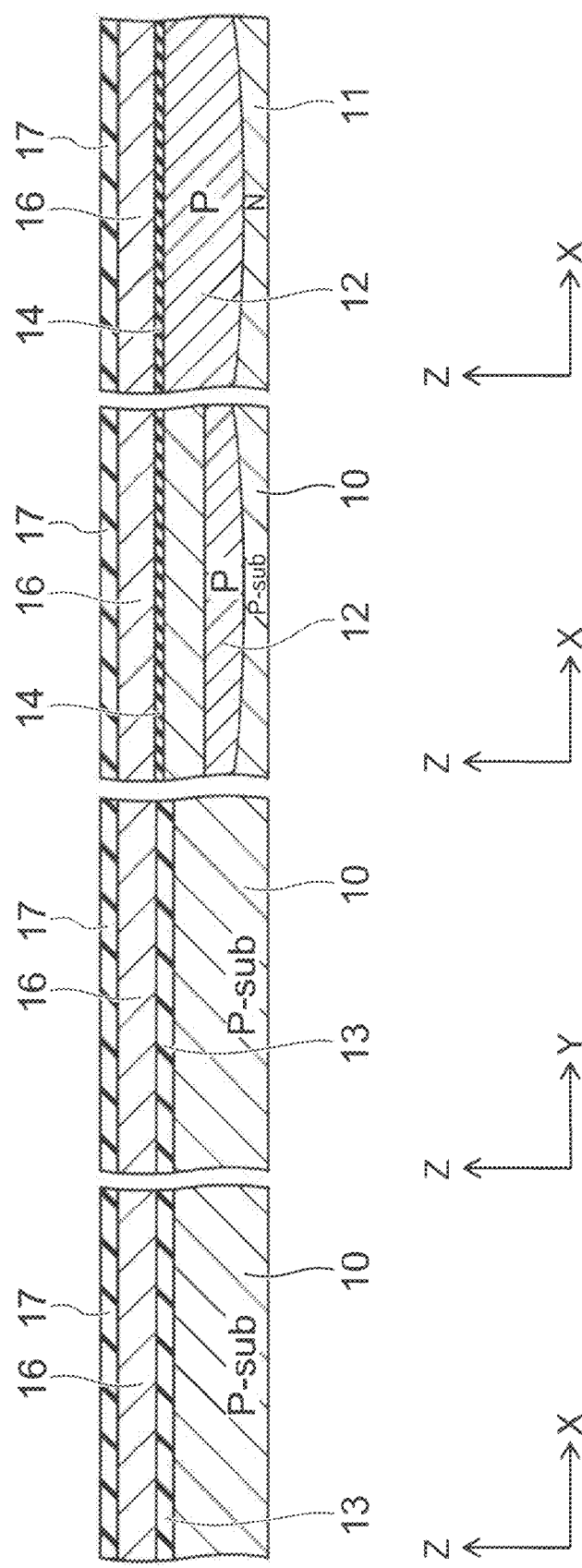

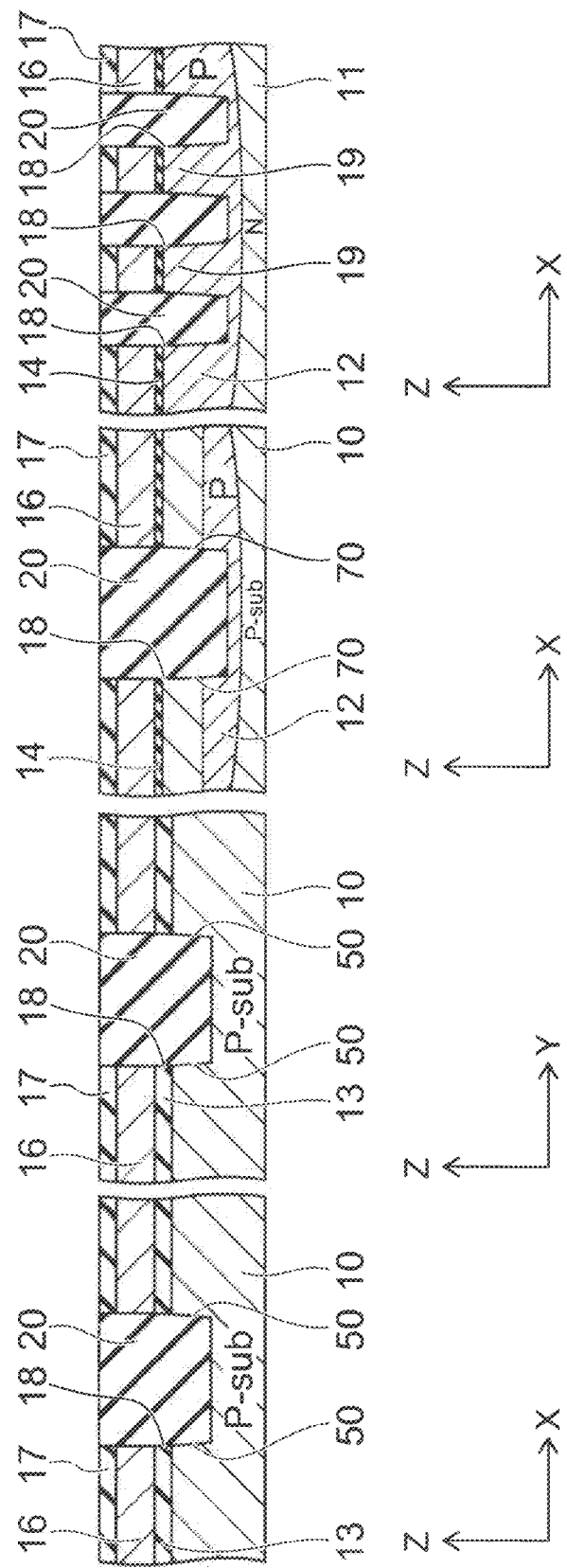

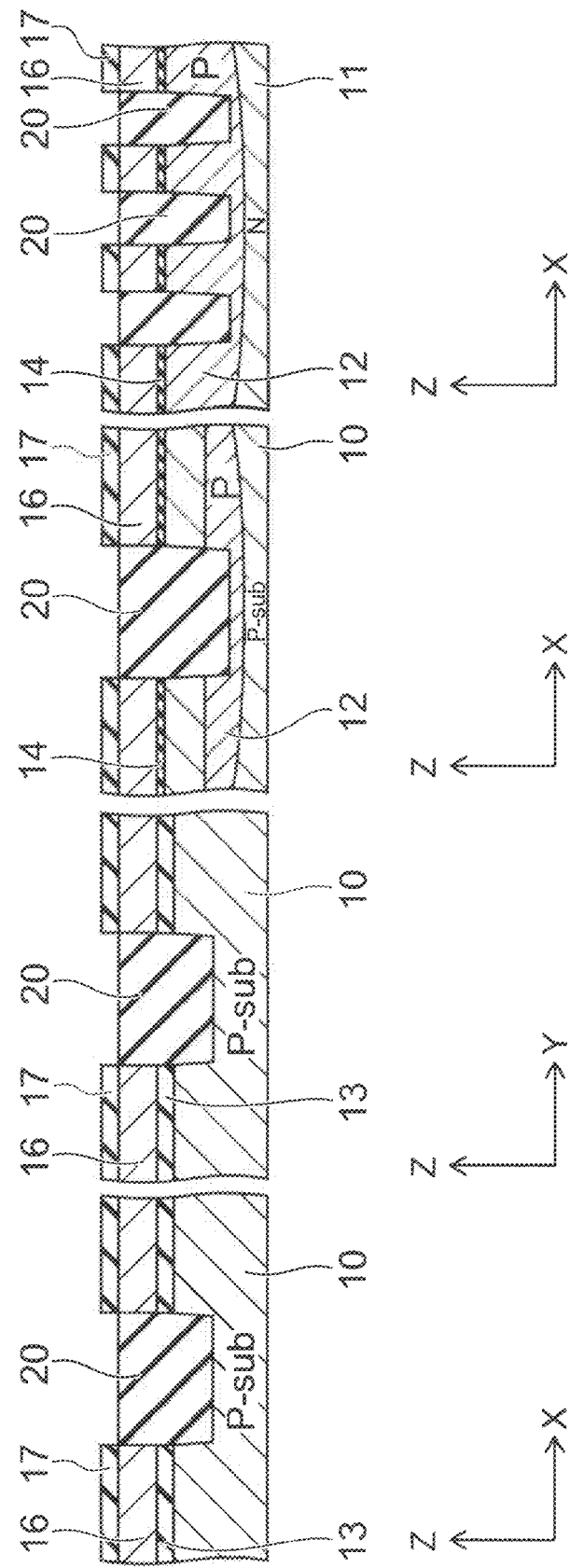

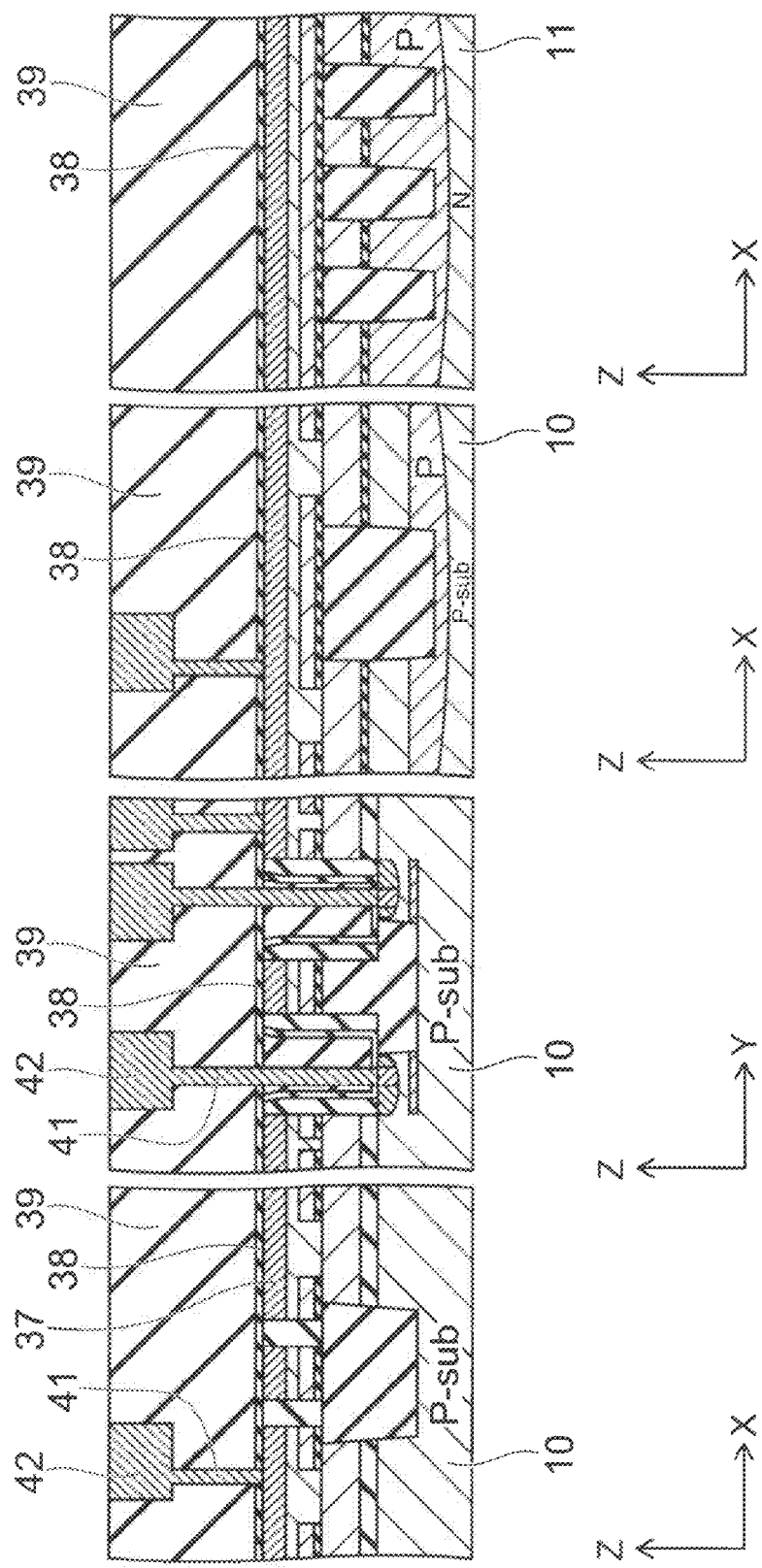

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2010-58411, filed on Mar. 15, 2010; the entire contents of which are incorporated herein by reference.

FIELD

Embodiments described herein relate generally to a semiconductor device and method for manufacturing the same.

BACKGROUND

In general, when multiple high breakdown-voltage transistors are arranged on a semiconductor substrate, the high breakdown-voltage transistors are isolated from each other with an element isolation insulating film (shallow trench isolation: STI). For the purpose of securing a breakdown voltage for the high breakdown-voltage transistors, a well is not formed around the high breakdown-voltage transistors. However, this causes depletion layers of two adjacent high breakdown-voltage transistors to come into contact with each other when a high voltage is applied to the gate electrodes of the high breakdown-voltage transistors. That is, punch-through may occur. This may cause a leakage current to flow between the adjacent high breakdown-voltage transistors.

As a countermeasure against this, a technology of forming an impurity diffusion region directly below a STI has been proposed. However, a method of forming the impurity diffusion region directly below the STI has a problem of deteriorating device characteristics with shrinking semiconductor devices.

BRIEF DESCRIPTION OF THE DRAWINGS

FIG. 7A shows a profile along line E of FIG. 4,
and FIG. 7B shows a profile along line F of FIG. 4;
FIGS. 10A to 10D are cross-sectional views of processes of a method for manufacturing a semiconductor device according to the embodiment;
FIGS. 11A to 11D are cross-sectional views of processes of the method for manufacturing the semiconductor device according to the embodiment;
FIGS. 13A to 13D are cross-sectional views of processes of the method for manufacturing the semiconductor device according to the embodiment;
FIGS. 15A to 15D are cross-sectional views of processes of the method for manufacturing the semiconductor device according to the embodiment;
FIGS. 16A to 16D are cross-sectional views of processes of the method for manufacturing the semiconductor device according to the embodiment;
FIGS. 22A to 22D are cross-sectional views of processes of the method for manufacturing the semiconductor device according to the embodiment.

DETAILED DESCRIPTION

Hereinafter, an embodiment of the invention will now be described with reference to the drawings.

Figure 1:
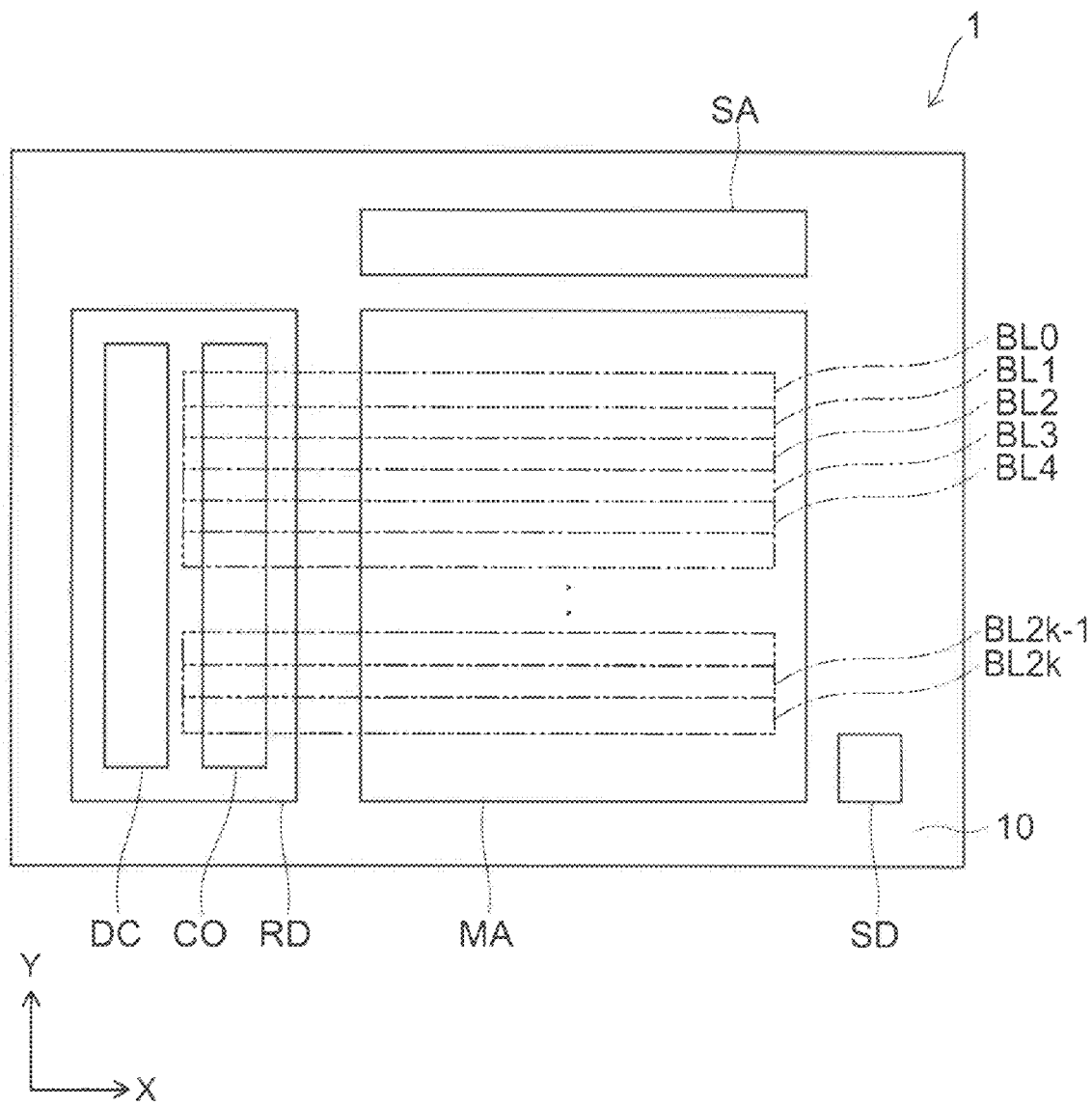
FIG. 1 is a block diagram of a semiconductor device according to an embodiment.

FIG. 1 is a block diagram illustrating a semiconductor device according to an embodiment.

Figure 2:
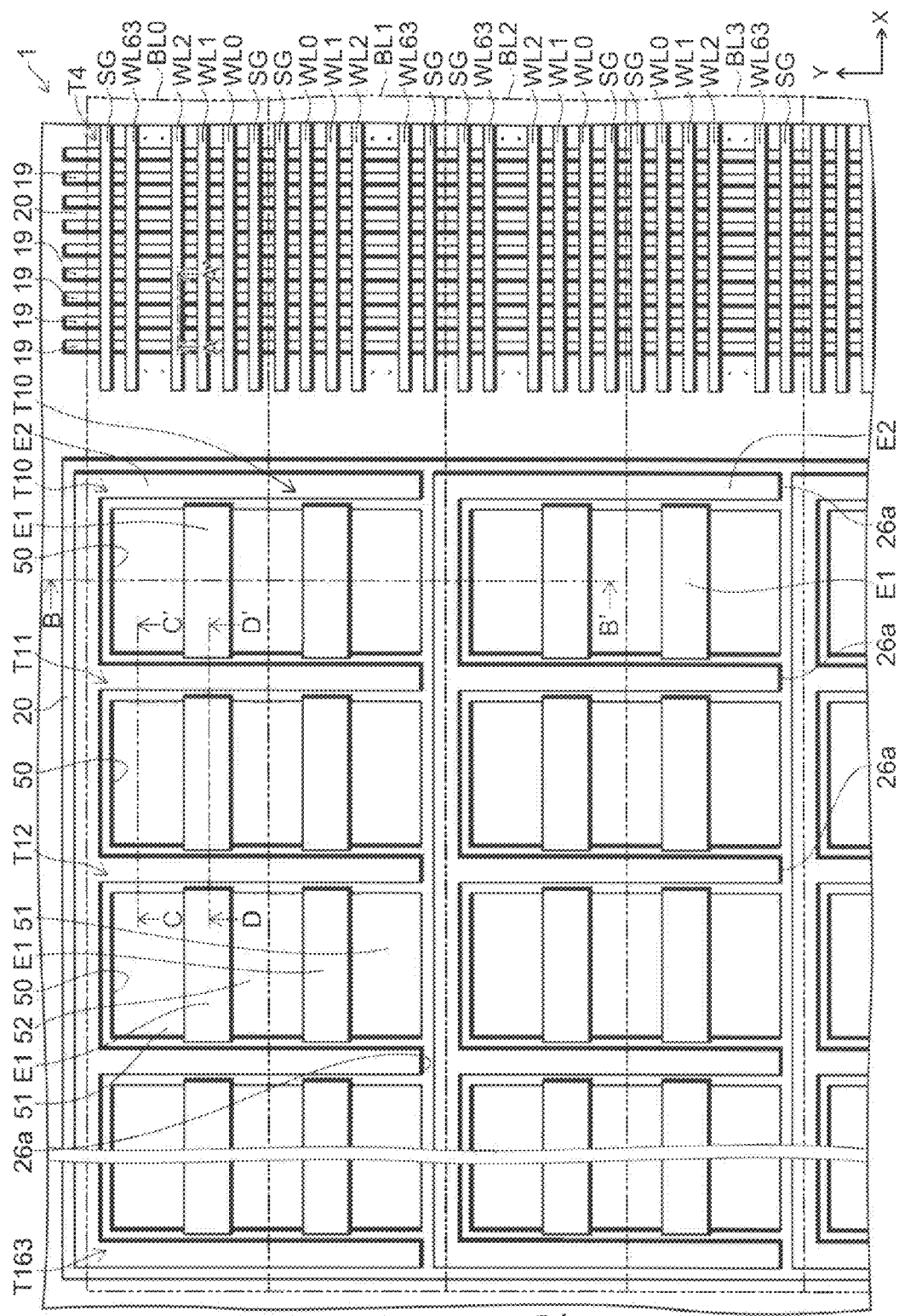
FIG. 2 is a plan view of a memory array and a core unit shown in FIG. 1.

FIG. 2 is a plan view illustrating a memory array and a core unit shown in FIG. 1.

Figure 3:
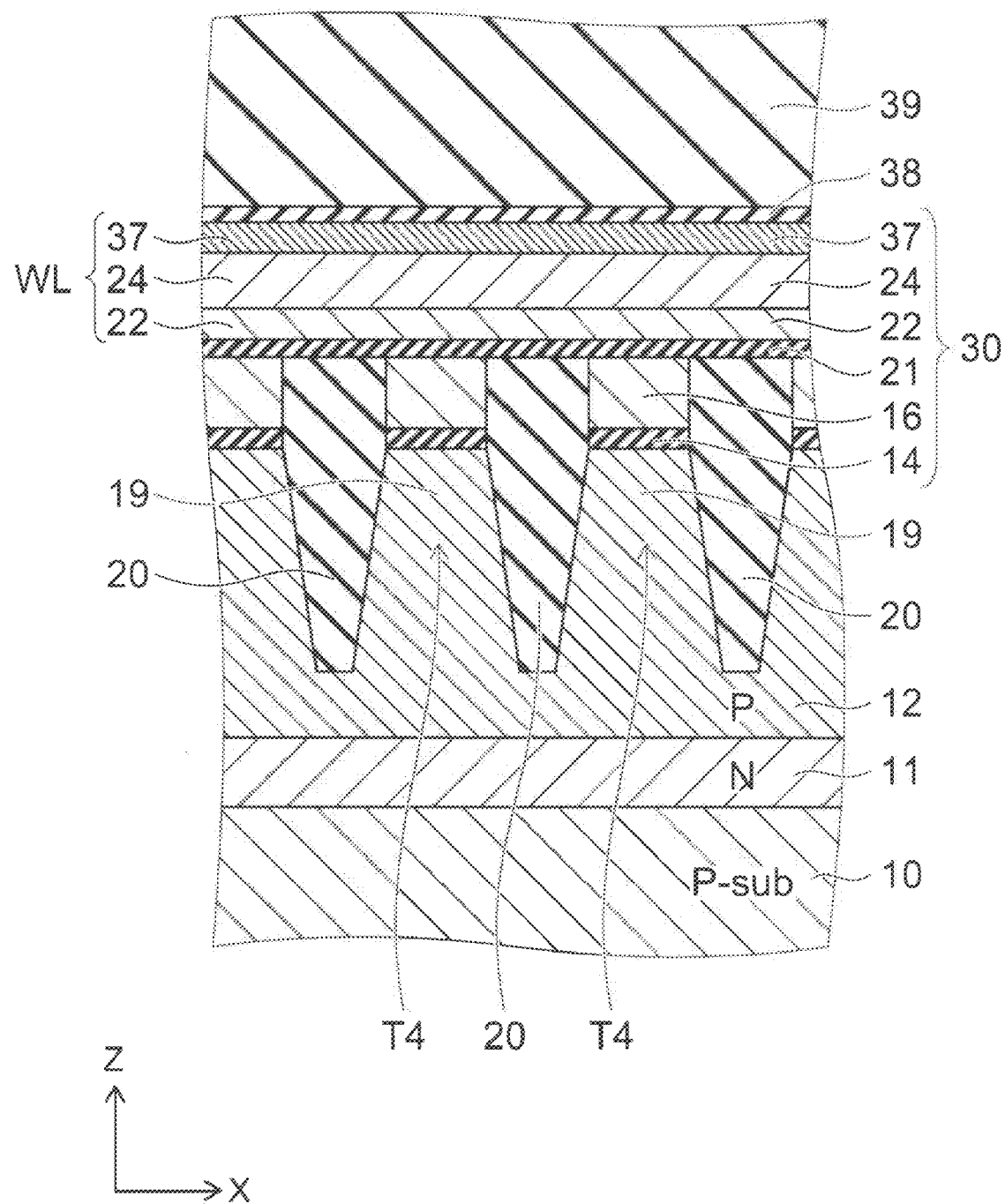
FIG. 3 is a cross-sectional view taken along line A-A' of FIG. 2.

FIG. 3 is a cross-sectional view taken along line A-A' of FIG. 2.

Figure 4:
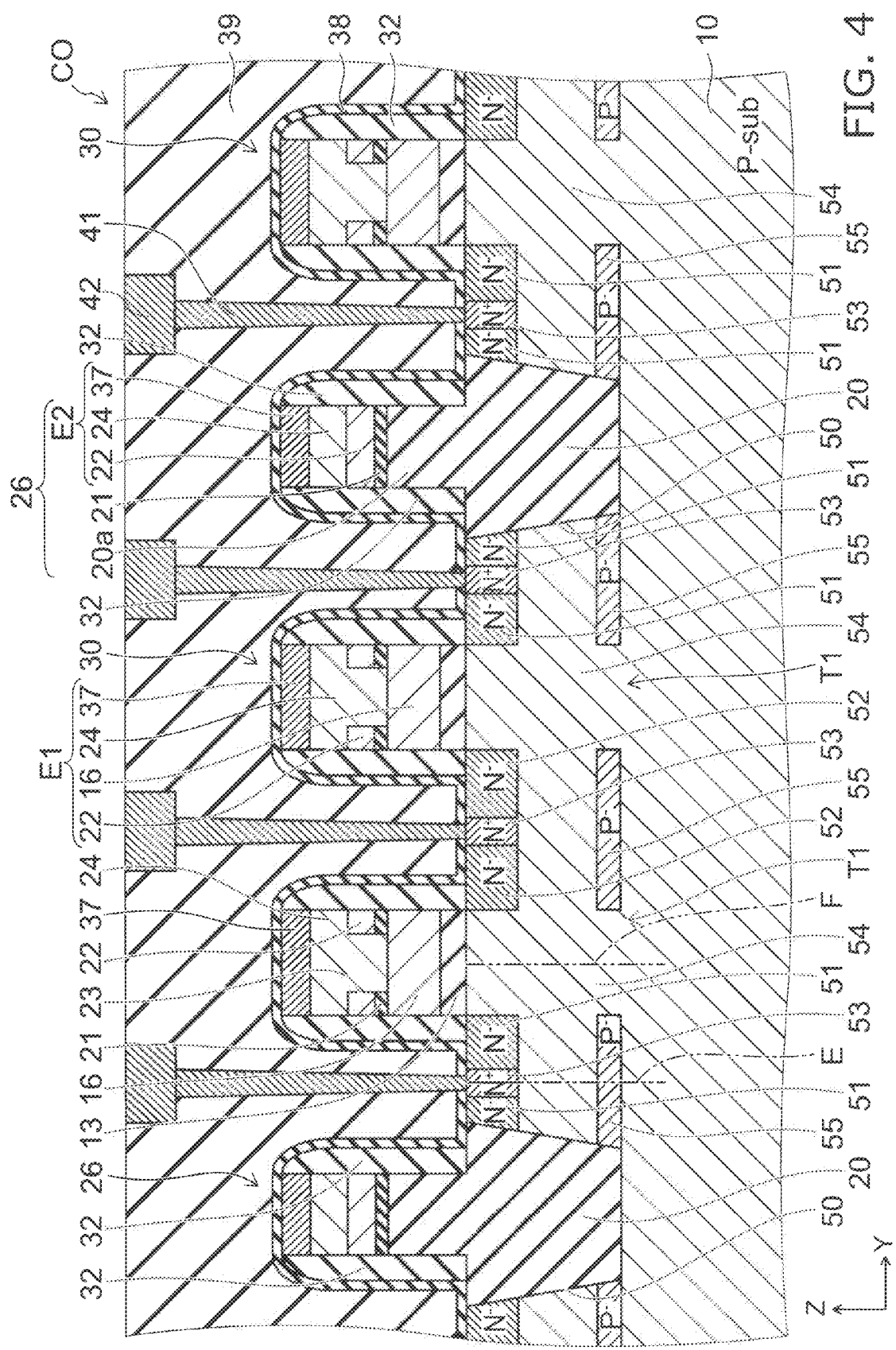
FIG. 4 is a cross-sectional view taken along line B-B' of FIG. 2.

FIG. 4 is a cross-sectional view taken along line B-B' of FIG. 2.

Figure 5:
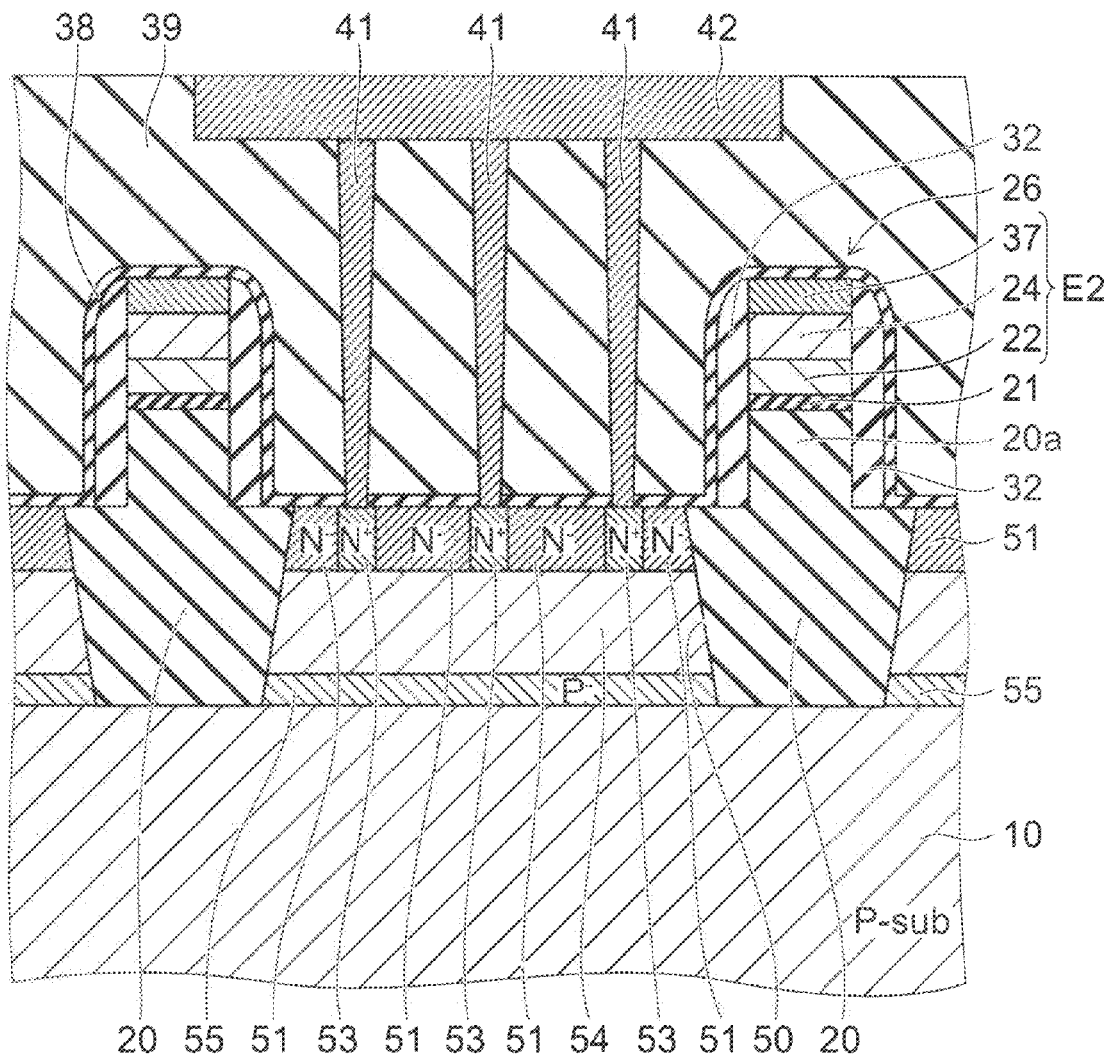
FIG. 5 is a cross-sectional view taken along line C-C' of FIG. 2.

FIG. 5 is a cross-sectional view taken along line C-C' of FIG. 2.

Figure 6:
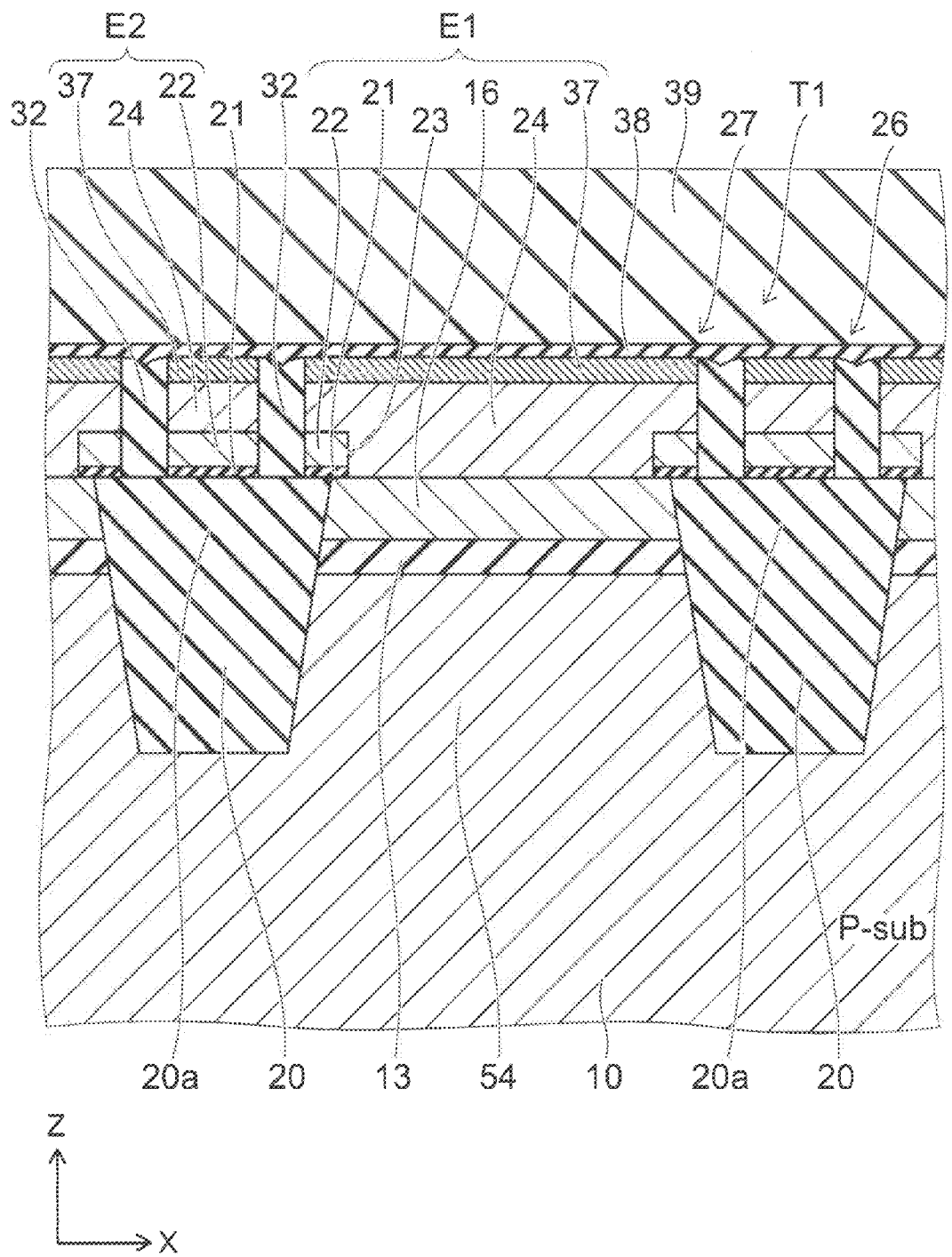
FIG. 6 is a cross-sectional view taken along line D-D' of FIG. 2.

FIG. 6 is a cross-sectional view taken along line D-D' of FIG. 2.

Figure 7A:
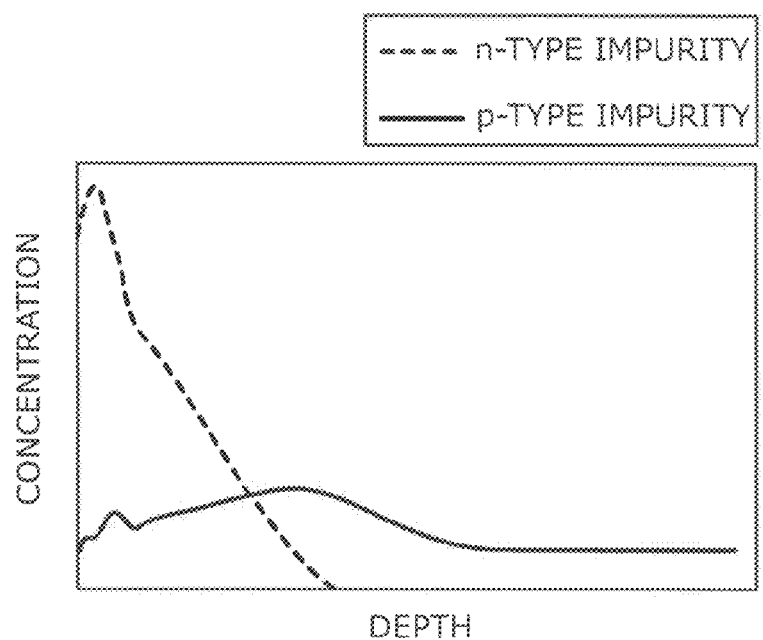
FIGS. 7A and 7B are graphs of impurity concentration profiles, where the horizontal axis represents a location in a depth-wise direction, the vertical axis represents an impurity concentration.
Figure 7B:
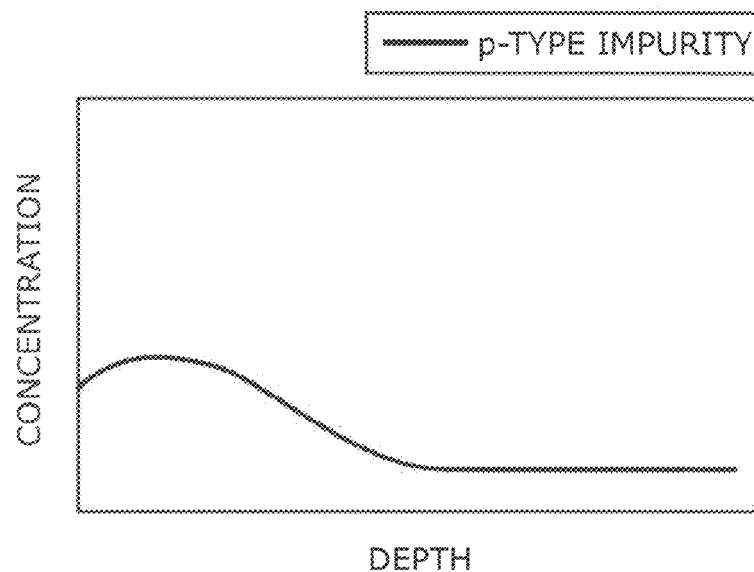

FIGS. 7A and 7B are graphs illustrating impurity concentration profiles, where the horizontal axis represents a location in a depth-wise direction and the vertical axis represents an impurity concentration. FIG. 7A shows a profile along line E of FIG. 4. FIG. 7B shows a profile along line F of FIG. 4.

Figure 8:
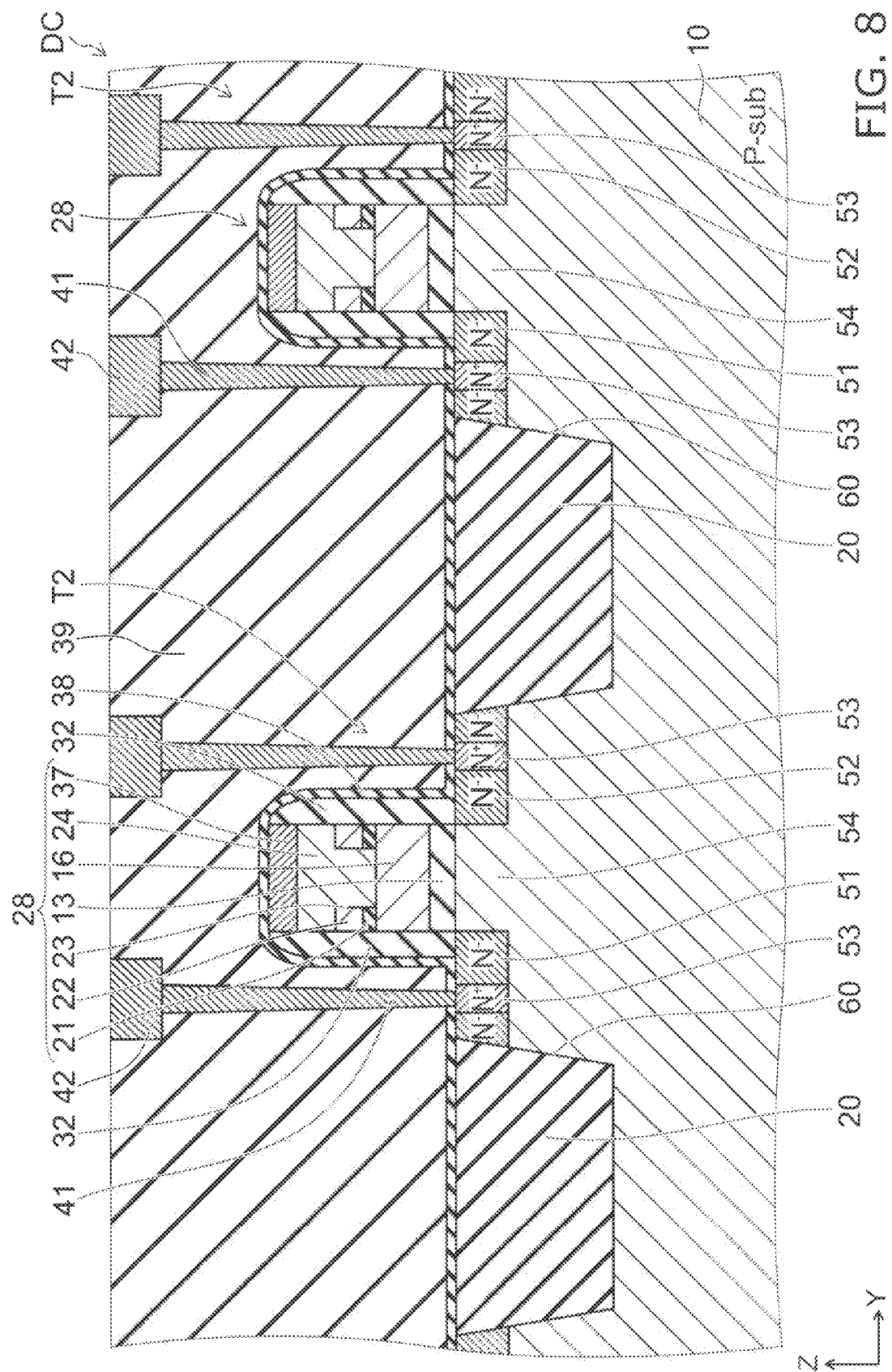
FIG. 8 is a cross-sectional view of high breakdown-voltage transistors formed in a decoder circuit unit shown in FIG. 1.

FIG. 8 is a cross-sectional view illustrating high breakdown-voltage transistors formed in a decoder circuit unit shown in FIG. 1.

Figure 9:
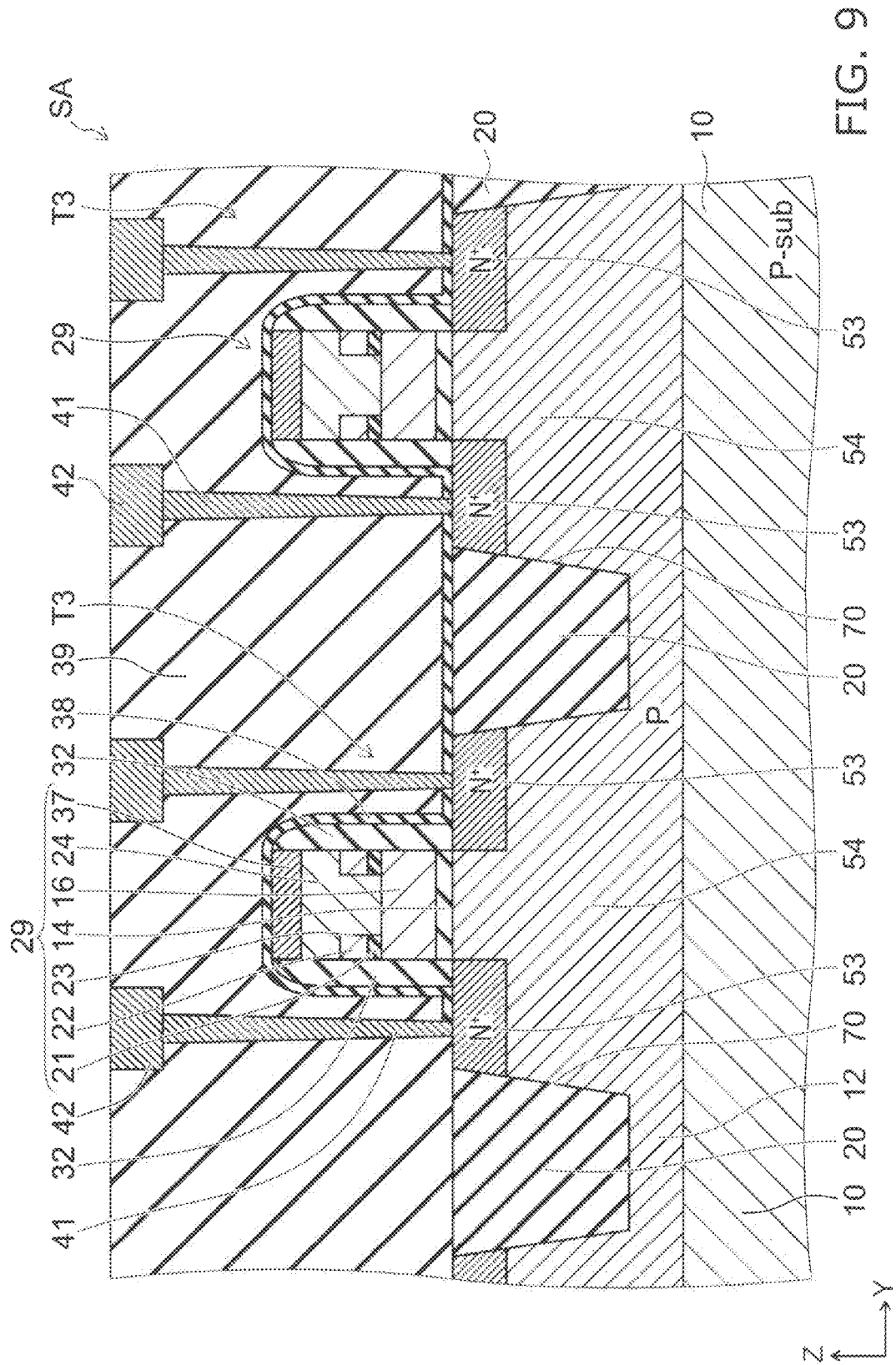
FIG. 9 is a cross-sectional view of low breakdown-voltage transistors formed in a sense amplifier unit shown in FIG. 1.
Figures 12A, 12B, 12C, 12D:
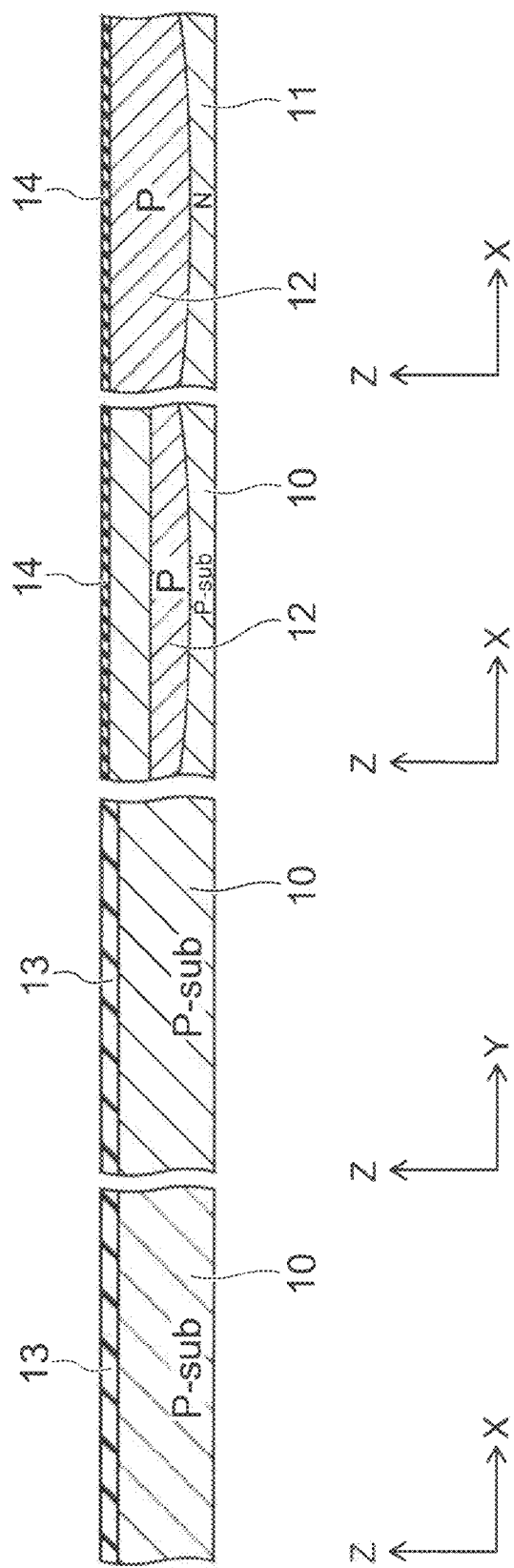
FIGS. 12A to 12D are cross-sectional views of processes of the method for manufacturing the semiconductor device according to the embodiment.
Figures 14A, 14B, 14C, 14D:
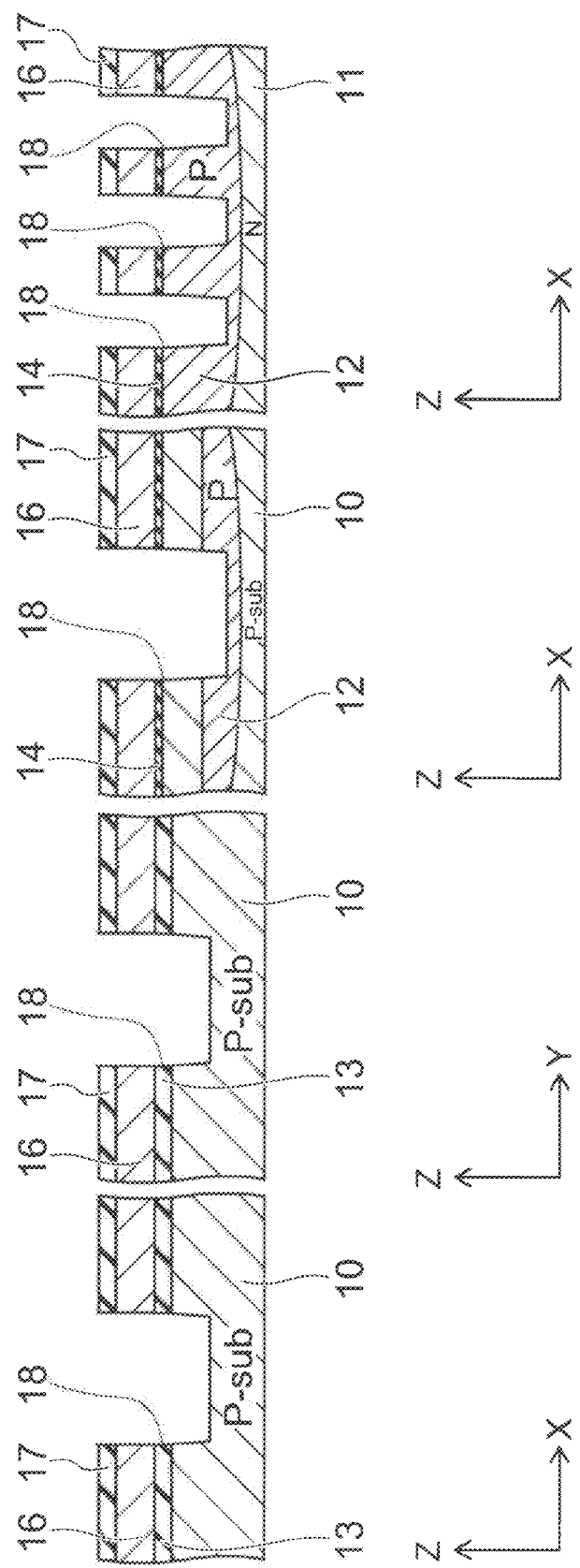
FIGS. 14A to 14D are cross-sectional views of processes of the method for manufacturing the semiconductor device according to the embodiment.
Figures 17A, 17B, 17C, 17D:
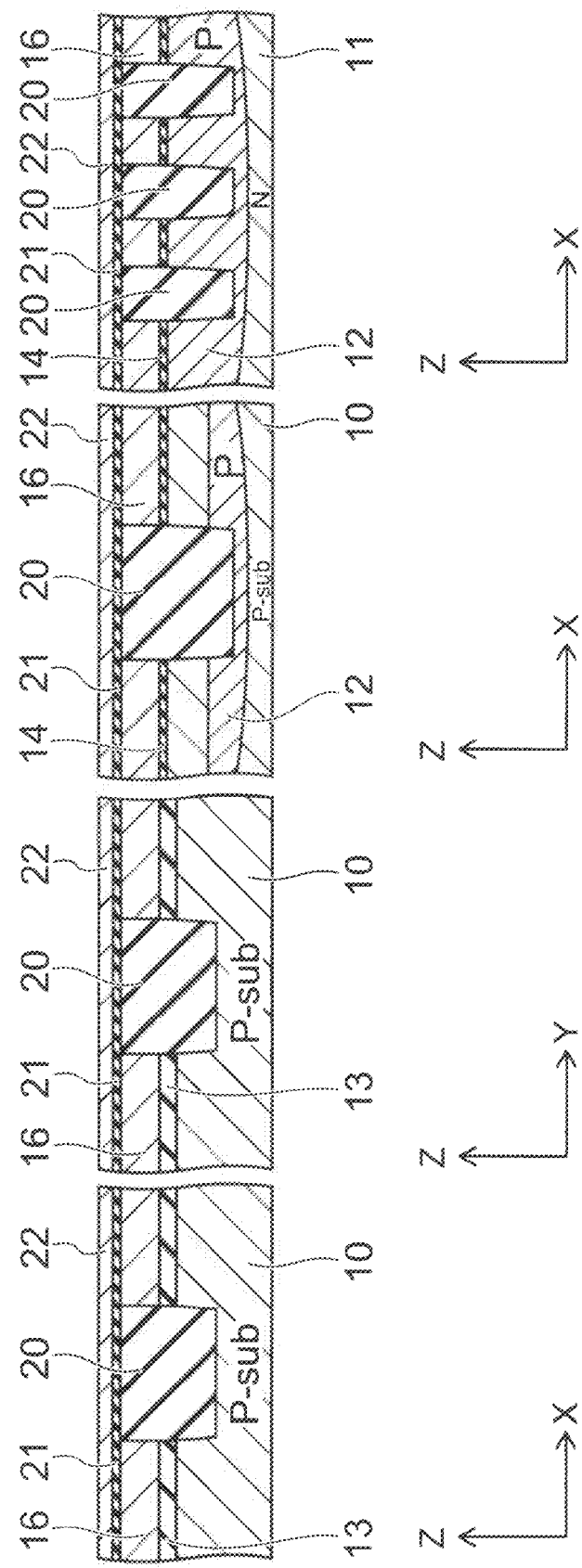
FIGS. 17A to 17D are cross-sectional views of processes of the method for manufacturing the semiconductor device according to the embodiment.
Figures 18A, 18B, 18C, 18D:
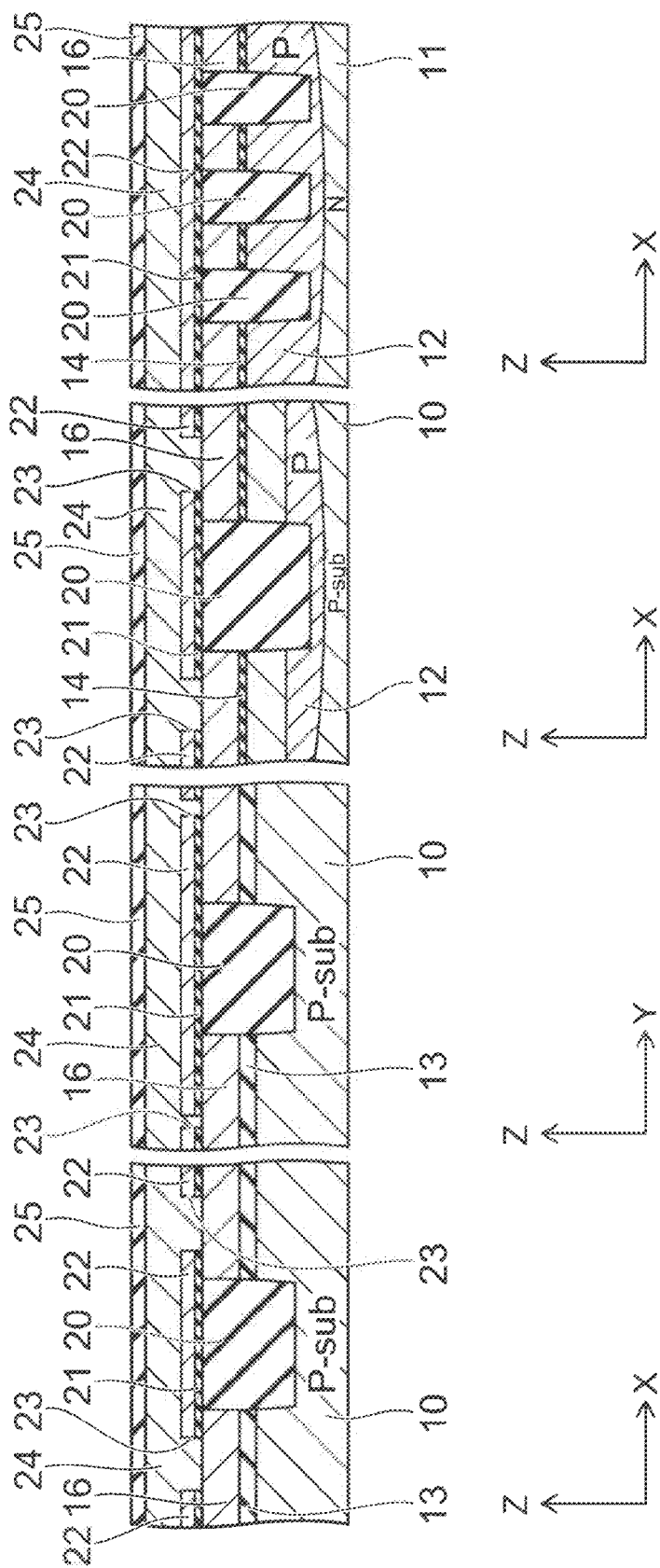
FIGS. 18A to 18D are cross-sectional views of processes of the method for manufacturing the semiconductor device according to the embodiment.

FIG. 9 is a cross-sectional view illustrating low breakdown-voltage transistors formed in a sense amplifier unit shown in FIG. 1.

For easier viewing of the drawing in FIG. 2, only main members are illustrated. In addition, a dimensional ratio of each unit among the drawings is not the same.

First, distinctive portions of this embodiment will be summarily described.

A semiconductor device according to this embodiment is a NAND-type flash memory. The NAND-type flash memory includes: a memory array in which multiple memory cells are provided; and a row decoder for supplying a drive voltage to word lines in the memory array. In the memory array, a memory transistor is disposed in each portion where an active area and a word line approximate each other at a maximum, and this constitutes one memory cell. The row decoder includes high breakdown-voltage transistors for switching whether or not to apply the drive voltage to each word line. The number of the high breakdown-voltage transistors is nearly equal to the number of the word lines. These high breakdown-voltage transistors are disposed in active regions of a silicon substrate divided by an element isolation insulating film (STI). These transistors are disposed directly in a semiconductor substrate without interposing a well therebetween to secure a junction breakdown voltage.

In the conventional technology described above, an impurity diffusion region is formed directly below the STI. Even if a depletion layer occurs in a high breakdown-voltage transistor, the impurity diffusion region suppresses the depletion layer from wrapping around down below the STI to reach an adjacent high breakdown-voltage transistor. However, such an impurity diffusion region has a problem of deteriorating the characteristics of the high breakdown-voltage transistors. That is because the impurity diffusion region is formed by highly-accelerated ion implantation via the STI and an impurity scattered during the ion implantation may enter inside the active regions of the high breakdown-voltage transistors. Such a problem becomes more significant as the width of the STI is made smaller for the purpose of shrinking the semiconductor device. In addition, the reduction of the width of the STI increases the process costs because the formation of the impurity diffusion region requires a fine photolithographic process.

On the other hand, in this embodiment, a p-type punch-through stopper layer is formed in a region directly below a source layer and a drain layer of each of the high breakdown-voltage transistors. Thereby, the punch-through stopper layer stops the extension of a depletion layer; the depletion layer can be prevented from wrapping around down below the STI; and a leakage current caused by punch-through can be prevented from flowing. Furthermore, a gate electrode is divided for every active region, and a shield electrode is provided on a region between the active regions. This prevents an inversion layer from being formed in a region directly below the STI when a high voltage is applied to the gate electrode, and accordingly this prevents a leakage current from flowing via the inversion layer. As a result of these, it is possible to prevent a leakage current from flowing between two high breakdown-voltage transistors adjacent to each other. Moreover, in this embodiment, it is not necessary to form an impurity diffusion region directly below the STI for preventing punch-through. For this reason, the characteristics of the high breakdown-voltage transistors are not deteriorated even when the semiconductor device is shrunk.

Next, the configuration of the semiconductor device according to this embodiment will be described in detail.

As shown in FIG. 1, a semiconductor device 1 according to this embodiment includes, for instance, a p-type silicon substrate 10 as a semiconductor substrate. A memory array MA, a row decoder RD, a sense amplifier SA, and a source line driver SD are provided on the silicon substrate 10.

Hereinafter, an XYZ orthogonal coordinate system will be introduced for convenience of description in the specification. Out of directions parallel to the upper face of the silicon substrate 10, a direction in which the memory array MA is provided as viewed from the row decoder RD is defined as an X-direction, and a direction in which the sense amplifier SA is provided as viewed from the memory array MA is defined as a Y-direction. A direction perpendicular to the upper face of the silicon substrate 10 is defined as a Z-direction. The X-direction, the Y-direction, and the Z-direction are orthogonal to one another.

As shown in FIGS. 1 and 2, the memory array MA includes multiple memory transistors T4 arranged in a matrix configuration. The memory transistor T4 is a transistor that includes a floating gate electrode and a control gate electrode. The multiple memory transistors T4 aligned along the X-direction share one word line, which is extending in the X-direction, as a common control gate electrode. A drive voltage is supplied to each word line by the row decoder RD. The drive voltage is supplied as one of several voltages which include: a writing voltage for injecting electrons into the floating gate electrode of the memory transistor T4; a reading voltage for detecting a threshold value of the memory transistor T4; and an erasing voltage for removing electrons from the floating gate electrode of the memory transistor T4. The drive voltage is a voltage that is usually higher than voltages for driving a logic circuit and the sense amplifier.

The row decoder RD includes a decoder circuit unit DC and a core unit CO. The decoder circuit unit DC decodes a row address signal inputted from the outside, generates a control signal, and outputs the control signal to the core unit CO. The decoder circuit unit DC includes high breakdown-voltage transistors T2 (see FIG. 8) in which a high voltage is applied between source and drain. As described above, the core unit CO includes high breakdown-voltage transistors T1 (see FIG. 4) that switch whether or not to apply the drive voltage to a certain word line. The number of the high breakdown-voltage transistors T1 is equal to the number of the word lines. The sense amplifier SA is a circuit that reads data from memory cells of the memory array MA. The sense amplifier SA includes low breakdown-voltage transistors T3 (see FIG. 9) to which no high voltage is applied. The source line driver SD is a circuit that applies a predetermined voltage to source lines of the memory array MA.

Hereinbelow, some of the above-described portions related to features of this embodiment will be described in detail.

First, the configuration of the memory array MA will be described.

In the memory array MA as shown in FIGS. 2 and 3, an n-type N well 11 is formed in an upper portion of the silicon substrate 10. A p-type P well 12 is formed in part of an upper portion of the N well 11. Multiple STIs 20 aligned in the Y-direction are formed in an upper portion of the P well 12 in parallel to one another. A portion of the P well 12 between the STIs 20 constitutes an active region 19. The upper face of the STI 20 projects upward from the upper face of the silicon substrate 10 (the P well 12).

Above the silicon substrate 10, a silicon oxide film 14 is disposed in a portion between the STIs 20. A polysilicon film 16 is provided on the silicon oxide film 14. The upper face of the polysilicon film 16 is almost as high as the upper face of the STI 20. Above the STIs 20 and the polysilicon film 16, an intermediate insulating film 21, a polysilicon film 22, a polysilicon film 24, and a metal salicide film 37 are stacked in order from the bottom. In this respect, the intermediate insulating film 21 is, for instance, one of high dielectric-constant films such as a silicon oxide film, a silicon nitride film, and an alumina film; or one of their stacked films (e.g., an ONO film, a NONON film, and a NOAON film).

The silicon oxide film 14, the polysilicon film 16, the polysilicon film 22, the polysilicon film 24, and the metal salicide film 37 are periodically divided along the Y-direction, and these constitute a gate structure 30 aligned in the X-direction. In the gate structure 30, the polysilicon film 16 is divided along both of the X-direction and the Y-direction so that the polysilicon film 16 is arranged in a matrix configuration along the X-direction and the Y-direction. On the other hand, the polysilicon film 22, the polysilicon film 24, and the metal salicide film 37 constitute a word line WL aligned in the X-direction. Furthermore, an impurity (an n-type impurity) serving as a donor is ion-implanted into a region of the active region 19 between regions directly below the gate structure 30, and an impurity diffusion layer (not illustrated) is formed.

Thereby, the memory transistor T4 is disposed in each intersection between the active region 19 aligned in the Y-direction and the word line WL aligned in the X-direction, as viewed from the Z-direction. In the memory transistor T4, the polysilicon film 16 functions as a floating gate electrode; the word line WL formed of the polysilicon film 22, the polysilicon film 24, and the metal salicide film 37 functions as a control gate electrode; the silicon oxide film 14 functions as a gate insulating film for insulating the active region 19 and the polysilicon film 16 from each other; and the intermediate insulating film 21 functions as an inter-electrode insulating film for insulating the floating gate electrode (the polysilicon film 16) and the control gate electrode (the polysilicon films 22 and 24 and the metal salicide film 37) from each other.

Moreover, a sidewall (not illustrated) made of, for instance, a silicon nitride is provided between the gate structures 30. A silicon nitride film 38 is disposed to cover the surfaces of the gate structures 30 and the sidewall. A silicon oxide film 39 is provided to embed the gate structures 30.

The memory array MA is divided into multiple blocks arranged along the Y-direction. For instance, the memory array MA includes $2 \times 2^{10}$ (2048) blocks BL0 to BL2$k$. Each of the blocks includes, for instance, 64 word lines WL. These word lines WL will be hereinafter referred to as the word lines WL0 to WL63 as necessary. A selection gate electrode SG is provided in both sides of a group consisting of the word lines WL0 to WL63. The selection gate electrode SG is made in a gate structure similar to the gate structure 30 and is configured by bonding the polysilicon film 16, the polysilicon films 22 and 24, and the metal salicide film 37 together.

Next, the configuration of the core unit CO of the row decoder RD will be described.

As shown in FIG. 2, the core unit CO includes high breakdown-voltage transistors T1. The number of the high breakdown-voltage transistors T1 is nearly equal to the number of word lines WL of the memory array MA. The high breakdown-voltage transistor T1 is considerably larger in size than the memory transistor T4. The length of one high breakdown-voltage transistor T1 in the Y-direction is almost equal to the length of one block of the memory array MA in the Y-direction and is accordingly almost equal to the length of an array including the 64 memory transistors T4. Furthermore, in the core unit CO, the high breakdown-voltage transistors T1 corresponding to each of the blocks of the memory array MA are aligned along the X-direction. In other words, in this embodiment, because the 64 word lines WL0 to WL63 are provided in each of the blocks of the memory array MA, the 64 high breakdown-voltage transistors T10 to T163 are aligned along the X-direction, that is, a direction in which the word lines WL are extending, in a region situated in the X direction as viewed from the corresponding blocks, in the core unit CO.

As shown in FIGS. 2, 4, 5 and 6, in the core unit CO, the STIs 20 are disposed in a lattice-shaped configuration in an upper portion of the silicon substrate 10, and the STIs 20 divide an upper layer portion of the silicon substrate 10 into multiple rectangular active regions 50. In this embodiment, two high breakdown-voltage transistors T1 arranged along the Y-direction are formed in each of the active regions 50 and accordingly constitute a high breakdown-voltage transistor group. For these two high breakdown-voltage transistors T1, a source layer 51 is provided at both Y-direction end portions of the active region 50, and a common drain layer 52 is provided in an X-direction center portion of the active region 50. The source layer 51 and the drain layer 52 are isolated from each other. Gate electrodes E1 of the high breakdown-voltage transistors T1 belonging to the respective high breakdown-voltage transistor groups adjacent to each other in the X-direction are separated from each other on the STI 20. As an impurity (n-type impurity) serving as a donor, for instance, phosphorus is introduced into the source layer 51 and the drain layer 52, and the conductivity type is an $n^-$-type. $N^+$-type contact regions 53 are locally formed in the source layer 51 and the drain layer 52. For instance, arsenic is introduced into the contact regions 53. A region of the active region 50 between the source layer 51 and the drain layer 52 and a region directly therebelow are part of the silicon substrate 10.

Here, a region, which includes the region of the active region 50 directly below the source layer 51 and the drain layer 52, a region between the source layer 51 and the drain layer 52, and a region directly therebelow and which is higher than the lower face of the STI 20, is termed as a "channel region." The impurity concentration of a channel region 54, which includes the region between the source layer 51 and the drain layer 52 and the region directly therebelow, is almost equal to that of the silicon substrate 10. However, a p-type impurity may be introduced into a vicinity of the surface of the silicon substrate 10 within the channel region 54 for the purpose of controlling a threshold voltage of the high breakdown-voltage transistor T1 in some cases. In such a case, the impurity concentration of the vicinity of the surface of the silicon substrate 10 within the channel region is higher than that of a deep portion of the silicon substrate 10 (a portion deeper than the bottom portions of the source layer 51 and the drain layer 52).

Then, a p-type punch-through stopper layer 55 is provided in the region of the active region 50 directly below the source layer 51 and the drain layer 52. The effective impurity concentration of the punch-through stopper layer 55 is higher than that of the silicon substrate 10. Here, an "effective impurity concentration" is an impurity concentration, which contributes to the conduction of a semiconductor material. In the case where both a donor and an acceptor are included in the semiconductor material, the effective impurity concentration is defined as a concentration obtained by subtracting the offset between the impurity concentration of the donor and the impurity concentration of the acceptor. The punch-through stopper layer 55 is isolated from the source layer 51 and the drain layer 52. The position of the punch-through stopper layer 55 in the Z-direction is almost the same or higher than a lower end portion of the STI 20. In other words, the position of the lower face of the punch-through stopper layer 55 in the Z-direction is almost the same or higher than the position of the lower face of the STI 20. Here, the punch-through stopper layer 55 is isolated from the source layer 51 and the drain layer 52. In other words, the concentration gradient of impurities between the punch-through stopper layer 55 and the source layer 51 and between the drain layer 52 and the punch-through stopper layer 55 can be made gentle by interposing the silicon substrate 10 between the punch-through stopper layer 55 and the source layer 51 and the drain layer 52. As a result, junction leakage can be reduced. Moreover, the punch stopper layer 55 is not proved in the interior of the channel region 54 or directly below the channel region 54. In other words, the punch-through stopper layer 55 formed below the source layer 51 and the drain layer 52 is divided by a region directly below the gate electrode. As an impurity (a p-type impurity) serving as an acceptor, for instance, boron is introduced into the punch-through stopper layer 55.

Further, as shown in FIG. 6, the punch-through stopper layer 55 is not provided directly below the gate electrode E1 of the high breakdown-voltage transistor T1. The impurity concentration of a lower portion of the STI 20 to corresponding to a portion in which the gate electrode E1 of the high breakdown-voltage transistor T1 extends in the X-direction is almost equal to that of the silicon substrate 10. In other words, p-type impurity with a high concentration dose not exist in a region directly below the gate electrode E1 of the high breakdown-voltage transistor T1 or in a spot in which the gate electrodes E1 of the high breakdown-voltage transistors T1 belonging to the respective high breakdown-voltage transistor groups adjacent to each other in the X-direction are separated from each other. Accordingly, the impurity concentration is almost equal to that of the silicon substrate 10.

A gate structure 27 is provided in a region directly above the channel region 54 on the silicon substrate 10. In the gate structure 27, a silicon oxide film 13, the polysilicon film 16, the intermediate insulating film 21, the polysilicon film 22, the polysilicon film 24, and the metal salicide film 37 are stacked in order from the bottom. The silicon oxide film 13 is thicker than the silicon oxide film 14 of the memory array MA and functions as a gate insulating film of the high breakdown-voltage transistor T1. In addition, an opening 23 is formed in the intermediate insulating film 21 and the polysilicon film 22. The polysilicon film 24 enters the inside of the opening 23 and is accordingly in contact with the polysilicon film 16. The polysilicon films 16, 22, and 24 and the metal salicide film 37 are mutually connected to constitute an electrically integral conduction member, which functions as the gate electrode E1 of the high breakdown-voltage transistor T1. Furthermore, a sidewall 32 made of, for instance, a silicon oxide is formed on a side face of the gate structure 27, which faces to the Y-direction.

On the other hand, in each upper portion of the STI 20 having a lattice-shaped configuration, a projecting portion 20a projecting upward is formed in a width-wise direction center portion. In other words, the height of the upper face of the STI 20 at the width-wise direction center portion is higher than the height of the upper face of the surrounding silicon substrate 10. A structure which is the same as an upper portion of the gate structure 27 is provided on the projecting portion 20a. In other words, the intermediate insulating film 21, the polysilicon film 22, the polysilicon film 24, and the metal salicide film are stacked in order from the bottom. A gate structure 26 includes the intermediate insulating film 21, the polysilicon film 22, the polysilicon film 24, and the metal salicide 37, which are stacked in a region directly above the projecting portion 20a. Sidewalls 32 are provided on side faces of the gate structure 26. The polysilicon film 22, the polysilicon film 24, and the metal salicide film 37, which belong to the gate structure 26, constitute a shield electrode E2.

As viewed from the Z-direction, the gate structure 26 is provided in the interior of each straight portion of the STI 20 having a lattice-shaped configuration, and an upper portion of the gate structure 26 constitutes the shield electrode E2. Therefore, the shield electrode E2 is formed in a substantial lattice-shaped. However, as viewed from the Z-direction, in each row of the active regions 50 arranged along the X-direction, gaps 26a are formed in the gate structure 26 in regions where part of the STI 20 extending in the Y-direction meets part of the STI 20 extending in the X-direction. Therefore, as viewed from the Z-direction, neither the gate structures 26 nor the shield electrodes E2 are formed in a complete lattice pattern, and the gate structures 26 and the shield electrodes E2 are formed in a shape like multiple combs arranged along the Y-direction. In each of the combs, multiple teeth extending in the Y-direction are arranged along the X-direction, and a stem extending in the X-direction is connected to one end portion of the multiple teeth arranged along the X-direction.

Furthermore, impurity diffusion region is not formed in the region directly below the STI 20 in the semiconductor device 1. Therefore, the concentration of the p-type impurity in a portion of the silicon substrate 10 in contact with the lower face of the STI 20 is lower than the concentration of the p-type impurity in the punch-through stopper layer 55. For instance, in the case where the p-type impurity is boron, the concentration of boron in the portion of the silicon substrate 10 in contact with the lower face of the STI 20 is almost equal to the concentration of boron in the silicon substrate 10 itself, and is, for instance, approximately $1 \times 10^{15}$ cm$^{-3}$. On the other hand, the concentration of boron in the punch-through stopper layer 55 is, for instance, $1 \times 10^{16}$ to $1 \times 10^{18}$ cm$^{-3}$.

Moreover, above the silicon substrate 10, a silicon nitride film 38 is formed to cover the surfaces of the gate structures 26 and 27 and the sidewalls disposed on these side faces; and a silicon oxide film 39 is disposed to embed the gate structures 26 and 27 therein. A contact 41 is buried in a lower portion of the silicon oxide film 39, and an interconnection 42 is buried in an upper portion of the silicon oxide film 39. The lower end of the contact 41 is connected to the contact region 53, and the upper end of the contact 41 is connected to the interconnection 42. Thereby, the source layer 51 of the high breakdown-voltage transistor T10 is connected to the word line WL0 via the contact 41 and the interconnection 42. In general, in each block, the source layer 51 of the high breakdown-voltage transistor T1i is connected to the word line WLi via the contact 41 and the interconnection 42, where i is an integer from 0 to 63.

Hereinbelow, a concrete example of an impurity concentration profile of the active region 50 will be illustrated.

In FIGS. 7A and 7B, the broken line indicates the total amount of n-type impurity, and the continuous line indicates the total amount of p-type impurity. In addition, FIGS. 7A and 7B show results of simulating the impurity concentration profiles by use of an in-house simulator. Furthermore, the scale between the vertical-axis and the horizontal-axis of FIGS. 7A and 7B is equal.

As shown in FIG. 4 and FIG. 7A, in the source layer 51 and a region directly below the source layer 51, it is observed that the peak of the p-type impurity contained in the punch-through stopper layer 55 is lower than the peak of the n-type impurity contained in the source layer 51 and the contact region 53. In contrast to this, as shown in FIG. 7B, in the channel region and a region directly below the channel region, the peak of the p-type impurity corresponding to the channel region 54 is observed, but the peak of the n-type impurity corresponding to the punch-through stopper layer 55 is not observed. As clear from this impurity concentration profile, the punch-through stopper layer 55 is formed only in the region directly below the source layer 51 and the drain layer 52, whereas punch-through stopper layer 55 is not formed in the region directly below the channel region 54.

Next, the decoder circuit unit DC of the row decoder RD will be described.

Like the core unit CO, the decoder circuit unit DC is disposed in every block of the memory array MA.

In the decoder circuit unit DC as shown in FIG. 8, the STI 20 divides an upper portion of the silicon substrate into multiple active regions 60. One high breakdown-voltage transistor T2 is disposed in each of the active regions 60. The distance between the active regions 60 is longer than the distance between the active regions 50 in the core unit CO. That is because: the number of high breakdown-voltage transistors T2 disposed in the decoder circuit unit DC is smaller (in other words, a density with which the high breakdown-voltage transistors T2 are disposed is smaller); and a voltage transferred by the high breakdown-voltage transistor T2 is higher than a voltage transferred by the high breakdown-voltage transistor T1. In addition, punch-through stopper layer 55 is not formed in the active regions 60. Furthermore, shield electrode E2 (see FIG. 2) is not provided in a region between the active regions 60. The rest of the configuration of the high breakdown-voltage transistor T2 is similar to that of the high breakdown-voltage transistor T1.

Specifically, a gate structure 28 is provided in a region directly above the channel region 54. In the gate structure 28, the silicon oxide film 13, the polysilicon film 16, the intermediate insulating film 21, the polysilicon film 22, the polysilicon film 24, and the metal salicide film 27 are stacked in order from the bottom. The silicon oxide film 13 functions as a gate insulating film of the high breakdown-voltage transistor T2. The polysilicon film 16, the polysilicon film 22, the polysilicon film 24, and the metal salicide film 37, which are connected to each other via the opening 23, function as a gate electrode of the high breakdown-voltage transistor T2. The high breakdown-voltage transistor T2 may also be provided in a portion to which a high voltage is applied other than the row decoder RD.

Next, the sense amplifier section SA will be described.

Here, a description of an n-type transistor of the sense amplifier unit SA will be given.

In the sense amplifier unit SA as shown in FIG. 9, a P-well 12 is selectively formed in an upper portion of the silicon substrate 10. The STI 20 divides an upper portion of the P-well 12 into multiple active regions 70. The active region 70 is smaller in size than the active region 50 and the active region 60. In addition, shield electrode E2 (see FIG. 2) is not provided between the active regions 70.

An n-type low breakdown-voltage transistor T3 is provided in each of the active regions 70. The low breakdown-voltage transistor T3 is a transistor whose breakdown voltage is lower than that of the high breakdown-voltage transistors T1 and T2. Accordingly, as a gate insulating film, the silicon oxide film 14, which is thinner than the silicon oxide film 13, is provided in the low breakdown-voltage transistor T3. The rest of the configuration of the low breakdown-voltage transistor T3 is similar to that of the high breakdown-voltage transistor T2.

Specifically, a pair of the source layer 51 and the drain layer 53 is formed in spaced to each other in each of the active regions 70. The space between the source layer 51 and the drain layer 52 is the channel region 54. Furthermore, a gate structure 29 is provided in a region directly above the channel region 54 on the silicon substrate 10. In the gate structure 29, the silicon oxide film 14, the polysilicon film 16, the intermediate insulating film 21, the polysilicon film 22, the polysilicon film 24, and the metal salicide film 37 are stacked in order from the bottom. On the other hand, the punch-through stopper layer 55 (see FIG. 4) is not formed in the active region 70, either. In the low breakdown-voltage transistor T3, the polysilicon film 16, the polysilicon film 22, the polysilicon film 24, and the metal salicide film 37, which constitute the gate structure 29, function as a gate electrode. The low breakdown-voltage transistor T3 may also be provided in a portion to which no high voltage is applied other than the sense amplifier unit SA.

Next, the relationship among the transistor formation regions in the Z-direction will be described.

Regions of an upper face 10a of the silicon substrate 10 situated in the formation regions of the high breakdown-voltage transistors T1 and T2 are lower than regions situated in the formation regions of the low to breakdown-voltage transistor T3 and the memory transistor T4. On the other hand, the silicon oxide films 13 disposed in the formation regions of the high breakdown-voltage transistors T1 and T2 are thicker than the silicon oxide films 14 formed in the formation regions of the low breakdown-voltage transistor T3 and the memory transistor T4. As a result, the upper face of the silicon oxide film 13 is as high as the upper face of the silicon oxide film 14. Thereby, the polysilicon film 16, the intermediate insulating film 21, the polysilicon film 22, the polysilicon film 24 and the metal salicide film 37 are respectively disposed on almost the same height among all the transistor formation regions.

Next, a method for manufacturing a semiconductor device according to this embodiment will be described.

FIGS. 10A to 22D are cross-sectional views of processes illustrating the method for manufacturing a semiconductor device according to this embodiment. Each drawing numbered either A or B shows a region where the high breakdown-voltage transistor T1 is to be formed; each drawing numbered C shows a region where the low breakdown-voltage transistor T3 is to be formed; and each drawing numbered D shows a region where the memory transistor T4 is to be formed.

FIGS. 10A to 22D mainly show regions among the transistors.

As shown in FIGS. 10A to 10D, for instance, the p-type silicon substrate 10 is prepared as a semiconductor substrate. The upper face 10a of the silicon substrate 10 is etched in the regions where the high breakdown-voltage transistors T1 and T2 are to be formed (hereinafter also referred to as "high breakdown-voltage regions"). Thereby, portions of the upper face 10a situated in the high breakdown-voltage regions are positioned lower than portions situated in the regions where the low breakdown-voltage transistor T3 and the memory transistor T4 are to be formed (hereinafter also referred to as "low breakdown-voltage regions").

As shown in FIGS. 11A to 11D, in a region where the memory array MA is to be formed, an impurity (an n-type impurity) serving as a donor, for instance, phosphorus, is ion-implanted into the upper face 10a of the silicon substrate 10 to form the N well 11 in an upper portion of the silicon substrate 10. In the low breakdown-voltage regions, an impurity (a p-type impurity) serving as an acceptor, for instance, boron is ion-implanted into the upper face 10a of the silicon substrate 10 to form the P well 12 in an upper portion of the silicon substrate 10. At this time, in the region where the memory array MA is to be formed, the P well 12 is formed in the interior of the N well 11 as viewed from the Z-direction. A p$^+$-type channel region may be formed in regions where channels for the high breakdown-voltage transistors T1 and T2 and the low breakdown-voltage transistor T3 are to be formed by ion implantation of an impurity serving as an acceptor, for instance, boron into these regions. The silicon oxide film 13 with a thickness of, for instance, 30 to 50 nm is formed on the entire surface of the silicon substrate 10. As described above, the silicon oxide film 13 is a film that serves as the gate insulating film for the high breakdown-voltage transistors T1 and T2 in the completed semiconductor device 1.

As shown in FIGS. 12A to 12D, the silicon oxide film 13 is removed from the low breakdown-voltage regions by lithography and etching. The silicon oxide film 14 is formed on the silicon substrate 10 in the low breakdown-voltage regions. The film thickness of the silicon oxide film 14 is thinner than that of the silicon oxide film 13 and is 5 to 10 nm, for instance. At this time, the amount of etching applied to the silicon substrate 10 is controlled in the process shown in FIGS. 10A to 10D for the purpose of making the height of the upper face of the silicon oxide film 13 equal to the height of the upper face of the silicon oxide film 14. The silicon oxide film 14 is a film that serves as the gate insulating film for the low breakdown-voltage transistor T3 and the memory transistor T4 in the completed semiconductor device 1.

As shown in FIGS. 13A to 13D, the polysilicon film 16 is deposited on the entire surfaces of the polysilicon films 13 and 14. The polysilicon film 16 is a conductive film that constitutes lower portions of the gate electrodes of the high breakdown-voltage transistors T1 and T2, a lower portion of a gate electrode of the low breakdown-voltage transistor T3, and the floating gate electrode of the memory transistor T4 in the completed semiconductor device 1. A mask film 17 made of, for instance, silicon nitride is deposited on the entire surface of the polysilicon film 16.

As shown in FIGS. 14A to 14D, the mask film 17 is patterned by lithography and etching. The polysilicon film 16, the silicon oxide films 13 and 14, and the upper portion of the silicon substrate 10 are etched and selectively removed by using the patterned mask film 17 as a mask. Thereby, trenches 18 are formed between the regions where the high breakdown-voltage transistors T1 are to be formed, between the regions where the high breakdown-voltage transistors T2 are to be formed, between the regions where the low breakdown-voltage transistors T3 are to be formed, and between the regions where the active regions 19 are to be formed.

As shown in FIGS. 15A to 15D, a silicon oxide is deposited on the entire surfaces, and the upper face thereof is planarized by CMP (chemical mechanical polishing). Thereby, the silicon oxide is filled in the trenches 18 to form the STIs 20. At this time, the height of the upper face of the STI 20 is as high as the upper face of the mask film 17. Thereby, in the region where the high breakdown-voltage transistor T1 is to be formed, the STI 20 divides the upper portion of the silicon substrate 10 into the multiple active regions 50. In addition, in the region where the high breakdown-voltage transistor T2 is to be formed, the STI 20 divides the upper portion of the silicon substrate 10 into the multiple active regions 60 (see FIG. 8). Furthermore, in the region where the low breakdown-voltage transistor T3 is to be formed, the STI 20 divides the upper portion of the P well 12 into the multiple active regions 70. Moreover, in the region where the memory array MA is to be formed, the STI 20 divides the upper portion of the P well 12 of the silicon substrate 10 into the multiple active regions 19 aligned in the Y-direction.

As shown in FIGS. 16A to 16D, etching is performed in a condition that the silicon oxide is selectively removed, and an upper portion of the STI 20 is removed. Thereby, the height of the upper face of the STI 20 is made almost equal to the height of the upper face of the polysilicon film 16.

As shown in FIGS. 17A to 17D, the mask film 17 (see FIG. 16A to 16D) is removed. The intermediate insulating film 21 is formed on the polysilicon film 16 and the STI 20, and the polysilicon film 22 is formed thereon. The intermediate insulating film 21 serves as an inter-electrode insulating film for insulating the floating gate electrode from the control gate electrode of the memory transistor T4 in the completed semiconductor device 1.

As shown in FIGS. 18A to 18D, in the high breakdown-voltage regions and the region where the low breakdown-voltage transistor T3 is to be formed, the polysilicon film 22 and the intermediate insulating film 21 are selectively removed to form the opening 23. The polysilicon film 24 is deposited on the entire surface to cover the polysilicon film 22. At this time, the polysilicon film 24 is filled also in the opening 23 and is thus in contact with the polysilicon film 16. The polysilicon films 22 and 24 are conductive films that constitute upper portions of the gate electrodes E1 of the high breakdown-voltage transistors T1 and T2, the shield electrode E2, an upper portion of the gate electrode of the low breakdown-voltage transistor T3, and the control gate electrode of the memory transistor T4. A silicon oxide film 25 is formed on the polysilicon film 24.

As shown in FIGS. 19A to 19D, the silicon oxide film 25, the polysilicon film 24, the polysilicon film 22, the intermediate insulating film 21, the polysilicon film 16, and the silicon oxide films 13 and 14 are selectively removed and patterned. Thereby, the gate structure 27 is formed in the region where the high breakdown-voltage transistor T1 is to be formed; the gate structure 28 is formed in the region where the high breakdown-voltage transistor T2 is to be formed; the gate structure 29 is formed in the region where the low breakdown-voltage transistor T3 is to be formed; and the gate structure 30 is formed in the region where the memory array MA is to be formed. The gate structures 27, 28, and 29 are formed in parts of regions directly above the active regions 50, 60, and 70, respectively.

Figures 19A, 19B, 19C, 19D:
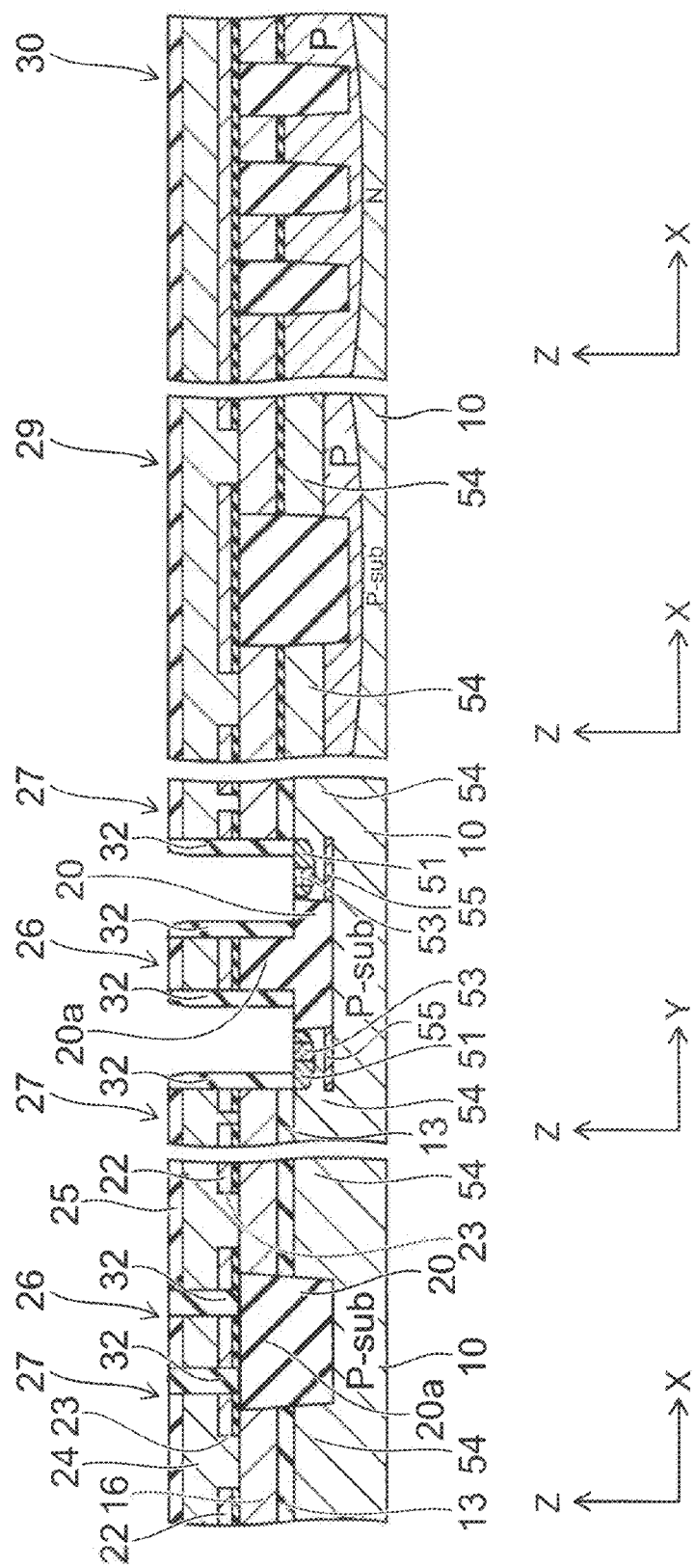
FIGS. 19A to 19D are cross-sectional views of processes of the method for manufacturing the semiconductor device according to the embodiment.

At this time, in between the regions where the high breakdown-voltage transistors T1 are to be formed, the silicon oxide film 25, the polysilicon film 24, the polysilicon film 22, the intermediate insulating film 21, and the upper portion of the STI 20 disposed directly below these films are selectively removed to form the gate structure 26. At this time, at both width-wise direction end portions of the STI 20, a portion of the STI 20 situated above the upper face of the silicon substrate 10 is removed. FIG. 19C shows an example in which a common gate electrode is shared between two low breakdown-voltage transistors T3 arranged in the width-wise direction of the gate (the X-direction).

An impurity serving as an acceptor, for instance, boron is ion-implanted using the gate structure 27 as a mask to form the punch-through stopper layer 55 whose conductivity type is a $P^+$-type in a pair of regions of the active region 50 sandwiching a region directly below the gate structure 27, that is, a region isolated from the upper face of the silicon substrate 10. The height of the lower face of the punch-through stopper layer 55 is set almost equal to the height of the lower face of the STI 20. At this time, the punch-through stopper layer 55 is not formed in a region directly below the gate structure 27. Furthermore, the punch-through stopper layer 55 is not formed in the region where the high breakdown-voltage transistor T2 is to be formed or in the low breakdown-voltage region.

An impurity serving as a donor, for instance, phosphorus is ion-implanted using the gate structures 27 to 30 as a mask to form the $n^+$-type source layers 51 and drain layers 52 (see FIG. 4) in mutually-isolated regions of the respective active regions 50, 60, and 70, which are in an upper layer portion of the silicon substrate 10. At this time, in the active region 50, the source layer 51 and the drain layer 52 are formed in a region directly above the punch-through stopper layers 55 in a self-alignment manner, respectively. In addition, a region of the silicon substrate 10 directly below the source layer 51 and the drain layer 52, a region between the source layer 51 and the drain layer 52, and a region directly therebelow configure the channel region 54. For instance, a silicon nitride is deposited on the entire surface, and anisotropic etching is performed to form the sidewalls 32 on the side faces of the gate structures 26 to 30. After that, an impurity serving as a donor, for instance, arsenic is ion-implanted using the gate structures 27 to 30 and the sidewalls 32 as a mask to form the $n^+$-type contact regions 53 locally in the interior of the source layers 51 and the drain layers 52.

Figures 20A, 20B, 20C, 20D:
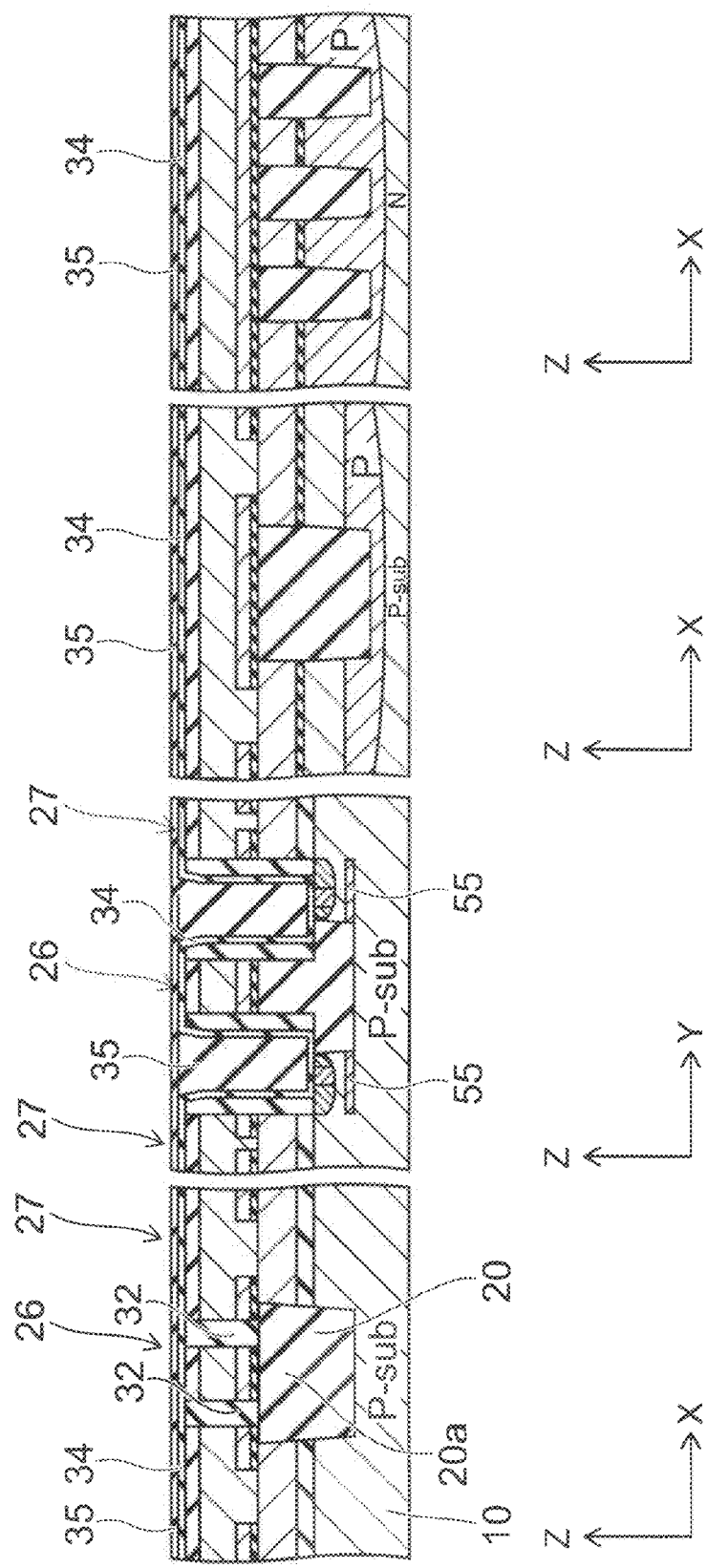
FIGS. 20A to 20D are cross-sectional views of processes of the method for manufacturing the semiconductor device according to the embodiment.
Figures 21A, 21B, 21C, 21D:
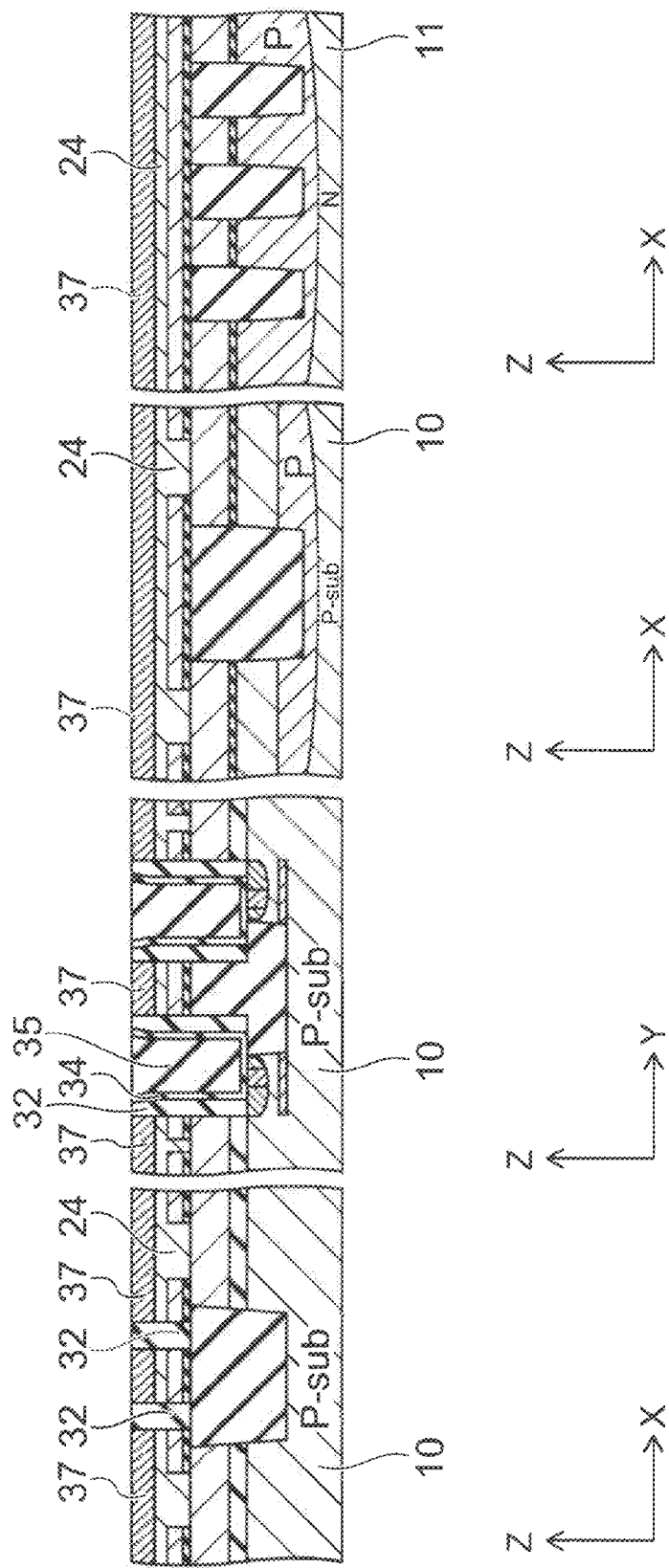
FIGS. 21A to 21D are cross-sectional views of processes of the method for manufacturing the semiconductor device according to the embodiment.

As shown in FIGS. 20A to 20B, a silicon nitride film 34 is formed on the entire surface, and a silicon oxide film 35 is thereafter deposited on the entire surface. The silicon nitride film 34 is formed to cover the gate structures and the sidewalls 32. The silicon oxide film 35 is formed to fill a gap between the gate structures.

As shown in FIGS. 21A to 21D, the silicon oxide film 35, the silicon nitride film 34, and the silicon oxide film 25 (see FIGS. 20A to 20D) are removed from the upper face of the polysilicon film 24 by etching. After that, a metal material is deposited on the polysilicon film 24, followed by heat treatment. Thereby, the metal salicide film 37 is formed in an upper portion of the polysilicon film 24.

As shown in FIGS. 22A to 22D, the silicon nitride film 38 is formed on the entire surface, and the silicon oxide film 39, which is thicker than the silicon nitride film 38, is formed thereon. By the usual method, the contact 41 and the interconnection 42 are formed in the interior of the silicon oxide film 39 and the silicon nitride film 38. The contact 41 is connected to the metal salicide film 37 and the contact region 53. Thus, the semiconductor device 1 according to this embodiment is manufactured.

Next, operations of this embodiment will be described.

In the semiconductor device 1 according to this embodiment, i.e., the NAND-type flash memory, once a row address signal is inputted into the row decoder RD, the decoder circuit unit DC of the row decoder RD decodes this row address signal to generate a control signal, hence outputting the control signal to the core unit CO. This control signal is inputted into the gate electrode E1 of the high breakdown-voltage transistor T1. On the other hand, a drive voltage is applied to the drain layer 52 of the high breakdown-voltage transistor T1. Once the high breakdown-voltage transistor T1 is switched to the ON state by the control signal, the drive voltage is applied to the word line WL from the source layer 51 of the high breakdown-voltage transistor T1 via the contact 41 and the interconnection 42. Thereby, the memory cells of the memory array MA are driven.

In addition, in the high breakdown-voltage transistor T1, depletion layers are generated from the lower faces of the source layer 51 and the drain layer 52. However, the punch-through stopper layer 55 is formed directly below the source layer 51 and the drain layer 52; therefore, the extension of the depletion layers can be stopped at the punch-through stopper layer 55. As a result, in between the high breakdown-voltage transistors T1 adjacent to each other, the depletion layers can be prevented from wrapping around down below the STI 20 to connect each other, and the occurrence of punch-through can be prevented.

In addition, the punch-through stopper layer 55 is formed lower than the source layer 51 and the drain layer 52, and no punch-through stopper layer 55 is formed in a region directly below the gate electrode E1. Therefore, the punch-through stopper layer 55 dose not contact (overlap) with the source layer 51, the drain layer 52, or the channel region 54, and the concentrations of the impurities of the source layer 51, the drain layer 52, and the channel region 54 do not fluctuate. Thereby, the characteristics of the high breakdown-voltage transistor T1 are not deteriorated.

On the other hand, a reference potential, e.g., a ground potential is applied to the shield electrode E2. Thereby, the electric field arising from the potential of the gate electrode E1 is eased, and an inversion layer can be prevented from being formed in a region directly below the SPI 20 between the active regions 50.

Next, effects of this embodiment will be described.

As described above, having the punch-through stopper layers 55 enables preventing the occurrence of punch-through. For this reason, a leakage current caused by punch-through can be prevented from occurring, and accordingly the high breakdown-voltage transistors T1 can be electrically isolated from each other reliably.

In addition, in this embodiment, the shield electrode E2 is provided on the STI 20. For this reason, the formation of an inversion layer in a region directly below the STI 20 can be suppressed by applying a potential, which is 0V or less, to this shield electrode E2. Accordingly, flow of a leakage current due to an inversion layer formed in the region directly below the STI 20 can be prevented. By this as well, the high breakdown-voltage transistors T1 can be electrically isolated from each other reliably.

Furthermore, in this embodiment, as described above, the high breakdown-voltage transistors T1 are effectively isolated from each other by providing the punch-through stopper layer 55 and the shield electrode E2. Therefore, it is not necessary to form an impurity diffusion region in the region directly below the STI 20 for element isolation. Accordingly, ion implantation for forming such an impurity diffusion region is not required, and the characteristics of the high breakdown-voltage transistor T1 are not deteriorated due to the ion implantation. If an impurity diffusion layer is formed, the impurity may be diffused to a region directly below the gate electrode due to heat process in some cases. In order to prevent this diffusion, the width of the STI 20 is increased. In contrast, in this embodiment, the high breakdown-voltage transistors T1 can be electrically isolated from each other without forming the impurity diffusion region. As a result, the width of the STI 20 can be narrowed, and the integration of the high breakdown-voltage transistors T1 can be implemented.

Furthermore, punch-through stopper layer 55 is not provided in a region of the channel region 54 between the source layer 51 and the drain layer 52 or in a region directly therebelow. As a result, the concentration of the p-impurity in the channel region 54 can be decreased, and the threshold voltage of the high breakdown-voltage transistor T1 can be reduced. Specifically, the threshold voltage of the high breakdown-voltage transistor T1 is reduced within a range such that the cutoff characteristic to be secured the reliability. Because the high breakdown-voltage transistor T1 transfers a high voltage in the core unit CO of the row decoder RD. For this reason, the high breakdown-voltage transistors T1 according to this embodiment are suitable for being disposed in the core unit CO of the row decoder RD.

On the other hand, unlike the high breakdown-voltage transistors T1, the high breakdown-voltage transistors T2 provided in a portion other than the core unit CO of the row decoder RD do not need to be disposed in each block of the memory array MA. For this reason, the interval between the active regions 60 may be set relatively wider. Accordingly, the high breakdown-voltage transistors T2 can be isolated from each other reliably without providing the punch-through stopper layer 55 and the shield electrode E2.

Because the low breakdown-voltage transistor T3 is disposed on the P well 12 and a high voltage is not applied between source and drain, the punch-through is less likely to occur and an inversion layer is less likely to be formed in the region directly below the STI for the low breakdown-voltage transistor T3 as compared to the high breakdown-voltage transistors T1 and T2. For this reason, the low breakdown-voltage transistors T3 can be isolated from each other reliably without setting the interval between the active regions 70 narrower than the interval between the active regions 50 and the interval between the active regions 60 and providing the punch-through stopper layer 55 and the shield electrode E2. Moreover, for the low breakdown-voltage transistors T3, if the punch-through stopper layers are formed in the regions directly below the source layer and the drain layer, these punch-through stopper layers are connected together in a region directly below the gate electrode. That is because the width (channel length) of the gate electrode is short. As a result, roll up in the short-channel characteristics occurs, and the circuit design becomes difficult.

In addition, p-type impurity with a high concentration dose not exist in a region directly below the gate electrodes E1 of the high breakdown-voltage transistors and a region in which the gate electrodes E1 of the high breakdown-voltage transistors T1 belonging to each of the high breakdown-voltage transistor groups adjacent to each other in the X-direction are isolated from each other.
Accordingly, the concentration of the impurity is almost equal to the concentration of the impurity in the silicon substrate 10. If a p-type impurity with a high concentration exists in the region directly below the gate electrodes E1 of the high breakdown-voltage transistors T1 (including the regions directly below the high breakdown-voltage transistors T1 formed on the STIs 20), the threshold voltages of the high breakdown-voltage transistors T1 is raised.

In this respect, in the case where an impurity diffusion region for element isolation is formed in the region directly below the STI 20, it is difficult to avoid forming this impurity diffusion region in the region directly below the gate electrode E1 of the high breakdown-voltage transistor T1. There is a very high possibility that this impurity diffusion region is formed in the region directly below the gate electrode E1 of the high breakdown-voltage transistor T1, which is formed on the STI 20, due to influences such as misalignment of lithography for forming this impurity diffusion region and the like. If the dimension of this impurity diffusion region as viewed from the Z-direction is reduced to avoid forming this impurity diffusion region in the region directly below the gate electrode E1 of the high breakdown-voltage transistor T1, the element isolation function is deteriorated.

On the other hand, in this embodiment, the punch-through stopper layer 55 is formed to self-align with the gate electrode E1 of the high breakdown-voltage transistor T1, and the bottom face of the punch-through stopper layer 55 is situated higher than the bottom face of the STI 20. For this reason, punch-through stopper layer 55 is not formed in the region directly below the gate electrode E1 of the high breakdown-voltage transistor T1 (including the region directly below the high breakdown-voltage transistor T1 formed on the STI 20). As a result, the threshold voltage of the high breakdown-voltage transistor T1 can be decreased.

Furthermore, in the case where a p-type impurity with a high concentration exists below the STI 20 of a portion in which the gate electrodes E1 of the high breakdown-voltage transistors T1 adjacent to each other in the X-direction are isolated, the threshold voltages of the high breakdown-voltage transistors T1 also increase. Because a high voltage of approximately 20V is applied to the gate electrode E1 of the high breakdown-voltage transistor T1, the electrical field influences not only the region directly below the gate electrode E1 of the high breakdown-voltage transistor T1 but also the peripheral region. Therefore, it is likeable that p-type impurity region with a high concentration dose not exist in the peripheral region of the region directly below the gate electrode E1 of the high breakdown-voltage transistor T1. In this embodiment, the concentration of the p-type impurity below the STI 20 of the portion in which the gate electrodes E1 of the high breakdown-voltage transistors T1 adjacent to each other in the X-direction are isolated from each other is almost equal to the concentration of the silicon substrate 10, and the impurity concentration is accordingly low. As a result, the threshold voltage of the high breakdown-voltage transistor T1 can be reduced effectively.

Moreover, in the core unit CO of the row decoder RD according to this embodiment, two high breakdown-voltage transistors T1 are disposed in one active region 50 along the gate-length direction (the Y-direction), and these two high breakdown-voltage transistors T1 share a common drain layer. Thereby, the length of each of the high breakdown-voltage transistors T1 in the Y-direction can be shortened, and accordingly the high breakdown-voltage transistors T1 can be more integrated.

Furthermore, in this embodiment, gaps are formed in the shield electrode E2, and the configuration of the overall shield electrode E2 as viewed from the Z-direction is a multiple combs-arranged configuration. By this, electric discharge in the shield electrode E2 due to a surge voltage can be prevented from occurring.

Furthermore, according to this embodiment, the punch-through stopper layers 55 are formed by ion implantation using the gate structures 27 as a mask in the process shown in FIGS. 19A to 19D. This ion implantation can be performed following the ion implantation for forming the source layers 51 and the drain layers 52. In addition, specialized fine photolithography is not required. Thereby, the punch-through stopper layers 55 can be formed only in the regions directly below the source layers 51 and the drain layers 52 in the self-alignment manner without increasing the process costs to a large extent.

Moreover, according to this embodiment, the shield electrodes E2 can be formed simultaneously with the gate electrodes of each transistor by patterning the polysilicon film 24, the polysilicon film 22, and the like in the process shown in FIGS. 19A to 19D. For this reason, specialized process for forming the shield electrodes E2 is not required, and accordingly the process costs do not increase. Additionally, this embodiment dose not require specialized fine photolithography to be performed. In this manner, according to this embodiment, the integrated high breakdown-voltage transistors T1 can be electrically isolated from each other reliably without deteriorating the characteristics of the high breakdown-voltage transistors T1 and increasing the process costs to a large extent.

Next, a variation of this embodiment will be described.

Figure 23:
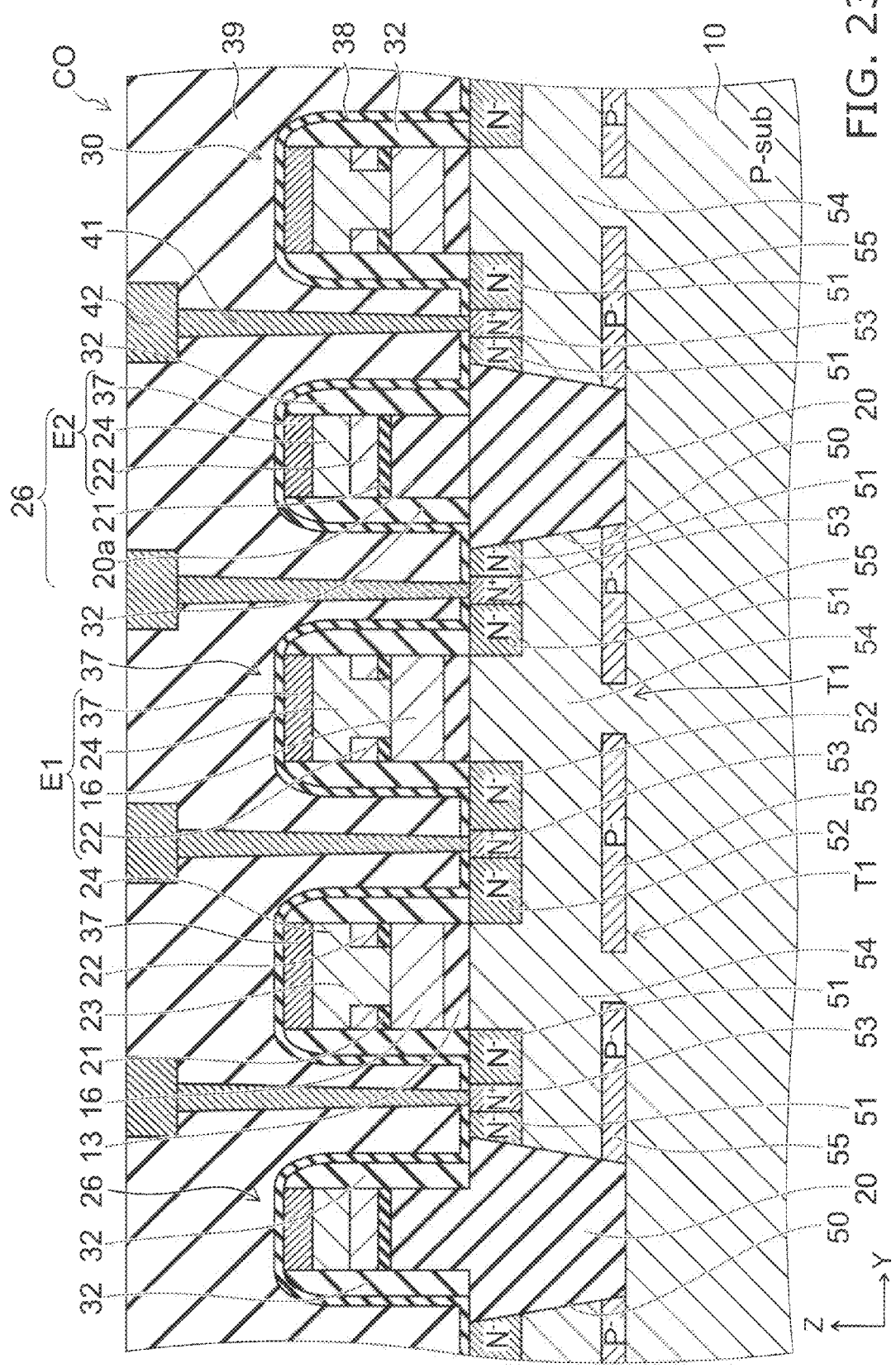
FIG. 23 is a cross-sectional view of a semiconductor device according to a variation of the embodiment.

FIG. 23 is a cross-sectional view illustrating a semiconductor device according to this variation.

In this variation, as shown in FIG. 23, punch-through stopper layers 55 extend into a region directly below a gate electrode from a region directly below a source layer 51 and a region directly below a drain layer 52 to come close to each other. However, in this case as well, the punch-through stopper layer 55 extending from the region directly below the source layer 51 and the punch-through stopper layer 55 extending from the region directly below the drain layer 52 are not connected to each other. In such a case, the punch-through stopper layers 55 may extend toward the region directly below the gate electrode as long as the punch-through stopper layers 55 are not connected to each other in the region directly below the gate electrode. Otherwise, the configuration, manufacturing method, operations, and effects of this variation are similar to those of the embodiment described above.

Hereinabove, the invention is described with reference to exemplary embodiments and variations. However, the invention is not limited to the exemplary embodiments and variations. Additions, deletions, or design modifications of components or additions, omissions, or condition modifications of processes appropriately made by one skilled in the art in regard to the exemplary embodiments described above are within the scope of the invention to the extent that the purport of the invention is included.

For instance, although an example is illustrated in the embodiment described above in which one active region 50 includes two high breakdown-voltage transistors T1, the invention is not limited thereto. One active region 50 may include one high breakdown-voltage transistor T1. Further, although an example is illustrated in the embodiment described above in which the configuration of a shield electrode E2 as viewed from the Z-direction is a multiple combs-arranged configuration along the Y-direction, the invention is not limited thereto. For instance, the shield electrode E2 may have a lattice-shaped configuration as viewed from the Z-direction without having gaps in the case where any appropriate units are provided to prevent electric discharge caused by a surge voltage. Furthermore, the shield electrode E2 may have a lattice-shaped configuration that surrounds each high breakdown-voltage transistor T1 in the case where one active region 50 includes one high breakdown-voltage transistor T1.

Moreover, the shield electrode E2 may be provided in not only between the high breakdown-voltage transistors T1, but also between the high breakdown-voltage transistors T2 and between the low breakdown-voltage transistors T3. Although an example is illustrated in the embodiment described above in which the silicon substrate is p-type conductivity type and the high breakdown-voltage transistor T1 is n-channel type, the silicon substrate 10 may be n-type and the high breakdown-voltage transistor T1 may be p-channel type. In such a case, two high breakdown-voltage transistors formed in one active region 50 may share a common source layer instead of a drain layer.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor substrate of a first conductivity type;
an element isolation insulating film dividing an upper layer portion of the semiconductor substrate into a plurality of first active regions;
a first source layer and a first drain layer being of a second conductivity type and formed spaced with respect to each other in an upper portion of each of the plurality of the first active regions;
a first gate electrode provided in a region directly above a first channel region in the semiconductor substrate located between the first source layer and the first drain layer;
a first gate insulating film provided between the semiconductor substrate and the first gate electrode;
a first punch-through stopper layer of the first conductivity type formed in a region of the first active region directly below the first source layer;
a second punch-through stopper layer of the first conductivity type formed in a region of the first active region directly below the first drain layer;
a well of the first conductivity type formed in an upper layer portion of the semiconductor substrate, an upper layer portion of the well being divided into a plurality of second active regions by the element isolation insulating film;
a second source layer and a second drain layer being formed spaced with respect to each other in an upper portion of each of the plurality of second active regions;
a second gate electrode provided in a region directly above a second channel region in the semiconductor substrate located between the second source layer and the second drain layer; and
a second gate insulating film provided between the semiconductor substrate and the second gate electrode,
the first punch-through stopper layer and the second punch-through stopper layer each having an effective impurity concentration higher than the semiconductor substrate,
the first punch-through stopper layer and the first source layer being separated in the first channel region,
the second punch-through stopper layer and the first drain layer being separated in the first channel region,
a first transistor including the first source layer, the first drain layer, the first gate insulating film, and the first gate electrode being formed in each of the first active regions,
a second transistor including the second source layer, the second drain layer, the second gate insulating film, and the second gate electrode being formed in each of the second active regions,
a width of the second gate electrode of the second transistor being smaller than a width of the first gate electrode of the first transistor,
the second gate insulating film of the second transistor being thinner than the first gate insulating film of the first transistor, and
a concentration of the first conductivity type impurity in the second active regions below the second source layer and second drain layer being lower than that of the first source layer and the first drain layer in the first active regions at the same position as the first and second punch-through stopper layers.

2. The device according to claim 1, further comprising a shield electrode provided on the element isolation insulating film.

3. The device according to claim 2, wherein the shield electrode contains a material identical with a material contained in the first gate electrode.

4. The device according to claim 2, wherein, as viewed from above, the shield electrode has a lattice-shaped configuration with a gap.

5. The device according to claim 2, wherein, as viewed from above, the shield electrode has a configuration of a plurality of combs arranged in one direction, each of the combs including a plurality of teeth extending in the one direction and a stem extending in a direction crossing the one direction and connected to one end portion of the plurality of teeth.

6. The device according to claim 1, wherein the first punch-through stopper layer and the second punch-through stopper layer are separated from each other in a region directly below the first gate electrode.

7. The device according to claim 1, wherein:
two first transistors are formed in each of the first active regions, and
the two first transistors share any one of the first source layer and the first drain layer.

8. The device according to claim 7, wherein the first punch-through stopper layer is also provided in a region directly below the shared first source layer, or the second punch-through stopper layer is also provided in a region directly below the shared first drain layer.

9. The device according to claim 1, further comprising:
a third source layer and a third drain layer being formed spaced with respect to each other in an upper portion of each of a plurality of third active regions;
a third gate electrode provided in a region directly above a third channel region in the semiconductor substrate located between the third source layer and the third drain layer; and
a third gate insulating film provided between the semiconductor substrate and the third gate electrode,
wherein
the element isolation insulating film divides an upper layer portion of the semiconductor substrate into a plurality of the third active regions,
a third transistor including the third source layer, the third drain layer, the third gate insulating film, and the third gate electrode is formed in each of the third active regions,
a distance between the third active regions is longer than a distance between the first active regions, and
a concentration of the first conductivity type impurity in the third active regions below the third source layer and the third drain layer is lower than that of the first source layer and the first drain layer in the first active regions at the same position as the first and second punch-through stopper layers.

10. The device according to claim 9, wherein no shield electrode is formed in a region between the second third active regions.

11. The device according to claim 1,
the device being a NAND-type flash memory, and further comprising a word line extending in one direction,
a plurality of transistor groups being arranged in the one direction in a row decoder of the NAND-type flash memory, each of the transistor groups including two first transistors and sharing the first drain layer, each of the first transistors including the first source layer, the first drain layer, the first gate insulating film, and the first gate electrode, the first gate electrodes belonging to the transistor groups adjacent to each other in the one direction being separated from each other on the element isolation insulating film.

12. The device according to claim 11, wherein, in a direction orthogonal to the one direction, a length of each of the first transistors is almost equal to a length of one block of a memory array of the NAND-type flash memory.

13. The device according to claim 1, wherein a concentration of a first conductivity type impurity of a portion of the semiconductor substrate in contact with a lower face of the element isolation insulation film is lower than the concentration of the first conductivity type impurity in the first punch-through stopper layer and the second punch-through stopper layer.

14. The device according to claim 1, wherein the second transistor is a memory transistor.

* * * * *